United States Patent
Konishi et al.

(10) Patent No.: US 10,367,090 B2
(45) Date of Patent: Jul. 30, 2019

(54) SILICON CARBIDE SEMICONDUCTOR DEVICE, POWER MODULE, AND POWER CONVERSION DEVICE

(71) Applicant: HITACHI, LTD., Tokyo (JP)

(72) Inventors: Kumiko Konishi, Tokyo (JP); Ryuusei Fujita, Tokyo (JP); Kazuki Tani, Tokyo (JP); Akio Shima, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 16/025,656

(22) Filed: Jul. 2, 2018

(65) Prior Publication Data

US 2019/0115465 A1    Apr. 18, 2019

(30) Foreign Application Priority Data

Oct. 12, 2017  (JP) .................. 2017-198593

(51) Int. Cl.
*H01L 29/78* (2006.01)
*H01L 29/16* (2006.01)

(52) U.S. Cl.
CPC ...... *H01L 29/7805* (2013.01); *H01L 29/1608* (2013.01)

(58) Field of Classification Search
CPC .................. H01L 29/7805; H01L 29/1608
See application file for complete search history.

(56) References Cited

U.S. PATENT DOCUMENTS

| 6,118,150 A | 9/2000 | Takahashi | |
| 7,851,882 B2* | 12/2010 | Okuno | H01L 29/872 257/472 |
| 2016/0141371 A1* | 5/2016 | Tega | H01L 21/0465 257/77 |

FOREIGN PATENT DOCUMENTS

JP    H09-270512 A    10/1997

OTHER PUBLICATIONS

M. Skowronski and S. Ha, "Degradtion of hexagonal silicon-carbide-based bipolar devices" Journal of Applied Physics 99, 011101 (2006).

S. Yamamoto, Y. Nakao, N. Tomita, S. Nakata, and S. Yamakawa, "Development of 3.3 kV SiC-MOSFET: Suppression of Forward Voltage Degradation of the Body Diode" Mater Sci. Forum 778-780, 951-954 (2014).

* cited by examiner

*Primary Examiner* — Karen Kusumakar
(74) *Attorney, Agent, or Firm* — Volpe and Koenig, P.C.

(57) ABSTRACT

Provided is a silicon carbide semiconductor device in which SiC-MOSFETs are formed within an active region of an n-type silicon carbide semiconductor substrate, and a $p^+$-type semiconductor region is formed on an upper surface of an epitaxial layer so as to surround the active region.

12 Claims, 17 Drawing Sheets

SILICON CARBIDE SEMICONDUCTOR DEVICE, POWER MODULE, AND POWER CONVERSION DEVICE

CROSS-REFERENCE TO RELATED APPLICATION

The present application claims priority from Japanese Patent Application No. 2017-198593 filed on Oct. 12, 2017, the content of which is hereby incorporated by reference into this application.

TECHNICAL FIELD OF THE INVENTION

The present invention relates to a silicon carbide semiconductor device, a power module and a power conversion device, and can be particularly utilized for a silicon carbide semiconductor device, a power module and a power conversion device comprising MOSFETs each having a body diode.

BACKGROUND OF THE INVENTION

In addition to high breakdown voltage, semiconductor power elements are required to have low ON-state resistance and low switching loss. However, silicon (Si) power elements mainly used for semiconductor power elements at present are approaching their theoretical performance limits. Silicon carbide (SiC) has a dielectric breakdown field strength that is greater than Si by approximately one order of magnitude. For this reason, a thickness of a drift layer maintaining a breakdown voltage is set to be approximately one-tenth thinner than that of the Si power element and an impurity concentration of this drift layer is set to be one hundred times greater than that of the Si power element, so that element resistance can be theoretically reduced by three orders of magnitude or more. In addition, SiC has a bandgap that is approximately three times larger than Si and thus is capable of operating in high temperatures. For this reason, SiC semiconductor elements exceeding the performance of Si semiconductor elements are awaited.

It is known that, in the SiC semiconductor element, a basal plane dislocation (BPD) present in a SiC drift layer expands to form a stacking fault during bipolar operation (Non-Patent Document 1: M. Skowronski and S. Ha, "Degradation of hexagonal silicon-carbide-based bipolar devices" Journal of Applied Physics 99, 011101 (2006)). When electrons and holes are recombined in the BPD, energy of this recombination causes the BPD to expand to form a stacking fault. Since a stacking fault has a high resistance, the element resistance increases as the stacking fault expands. This phenomenon is known as a "bipolar degradation phenomenon".

Patent Document 1 (Japanese Patent Application Laid-open Publication No. H09-270512) describes an IGBT (Insulated Gate Bipolar Transistor) utilizing a Si (silicon) substrate in which the holes generated in a side diffusion region of a p-type semiconductor layer facing a cell region are removed by flowing to an emitter electrode.

SUMMARY OF THE INVENTION

A MOSFET (Metal Oxide Semiconductor Field Effect Transistor) serving as a switching element containing SiC has a body diode. In a power module such as an inverter comprising such a switching element, a current (inductor's current) occasionally flows in a direction opposite to a forward direction with respect to the switching element. In order to prevent breakdown of the switching element by a surge voltage of the inductor's current, a diode (freewheeling diode) for flowing the inductor's current is connected in parallel to each switching element. It is desirable for the above-described body diode of the switching element to be used as a freewheeling diode in order to miniaturize the inverter.

However, it is reported in Non-Patent Document 2 (S. Yamamoto, Y. Nakao, N. Tomita, S. Nakata, and S. Yamakawa, "Development of 3.3 kV SiC-MOSFET: Suppression of Forward Voltage Degradation of the Body Diode" Mater. Sci. Forum 778-780, 951-954 (2014)) that a bipolar degradation phenomenon in which the BPD expands to form a stacking fault occurs by using a body diode. For this reason, it is necessary to improve reliability of the SiC-MOSFET in which bipolar degradation occurs and the stacking fault is formed.

Other objects in addition to the above-described objects and novel features of the present invention will be apparent from the description in the present specification and the attached drawings.

Among the embodiments described in the present application, a brief outline of a representative embodiment is as follows.

According to the representative embodiment, there is provided a silicon carbide semiconductor device in which SiC-MOSFETs are formed within an active region of a semiconductor substrate constituted by an n-type SiC substrate and an epitaxial layer formed on the SiC substrate, and a $p^+$-type semiconductor region which is a hole outflow region is formed on an upper surface of the epitaxial layer so as to surround the active region.

According to the representative embodiment, reliability of the silicon carbide semiconductor device can be improved. In particular, the silicon carbide semiconductor device in which a stacking fault is formed can be prevented from breakdown by heat generation caused by concentration of holes.

BRIEF DESCRIPTIONS OF THE DRAWINGS

DESCRIPTIONS OF THE PREFERRED EMBODIMENTS

Hereinafter, embodiments of the present invention will be concretely described with reference to the drawings. Note that, in all of the drawings used to describe the embodiments, the same members having the same functions are denoted by the same reference signs, and redundant descriptions thereof are omitted as appropriate. In addition, in the embodiments, the same or similar descriptions of components will not be repeated in principle unless otherwise particularly necessary.

In addition, the symbols "−" and "+" denote a relative concentration of impurities whose conductivity type is n-type or p-type, and, for example, an n-type impurity concentration increases in the order of "n−", "n" and "n+".

In the present application, a SiC substrate is occasionally referred to as "semiconductor substrate". However, a stacked substrate constituted by the SiC substrate and an epitaxial layer on the SiC substrate is also occasionally referred to as a "semiconductor substrate".

First Embodiment

<Configuration of Silicon Carbide Semiconductor Device>

Figure 1:
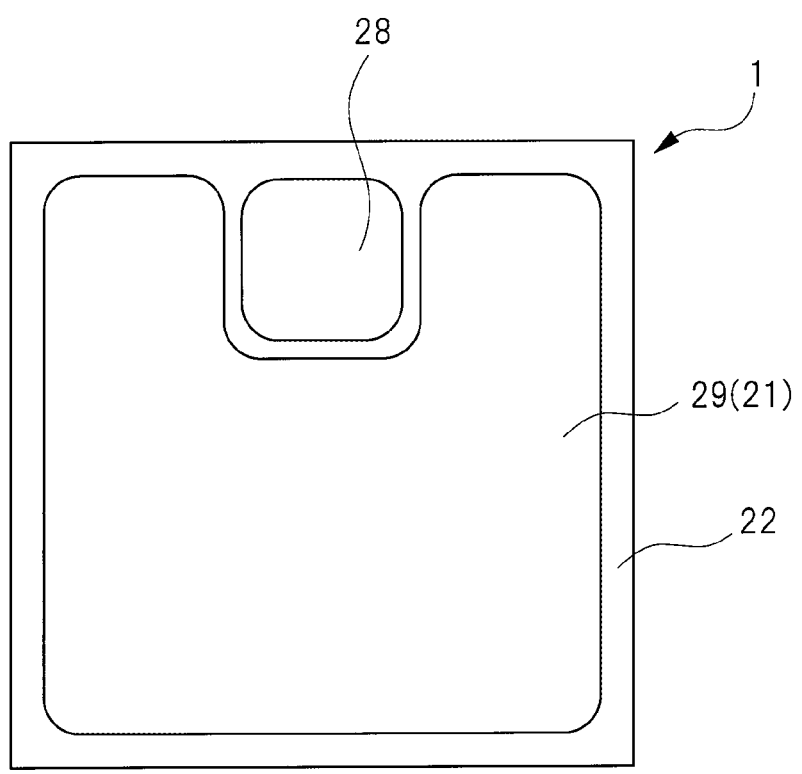
FIG. 1 is a plan view of a silicon carbide semiconductor device according to a first embodiment of the present invention.
Figure 2:
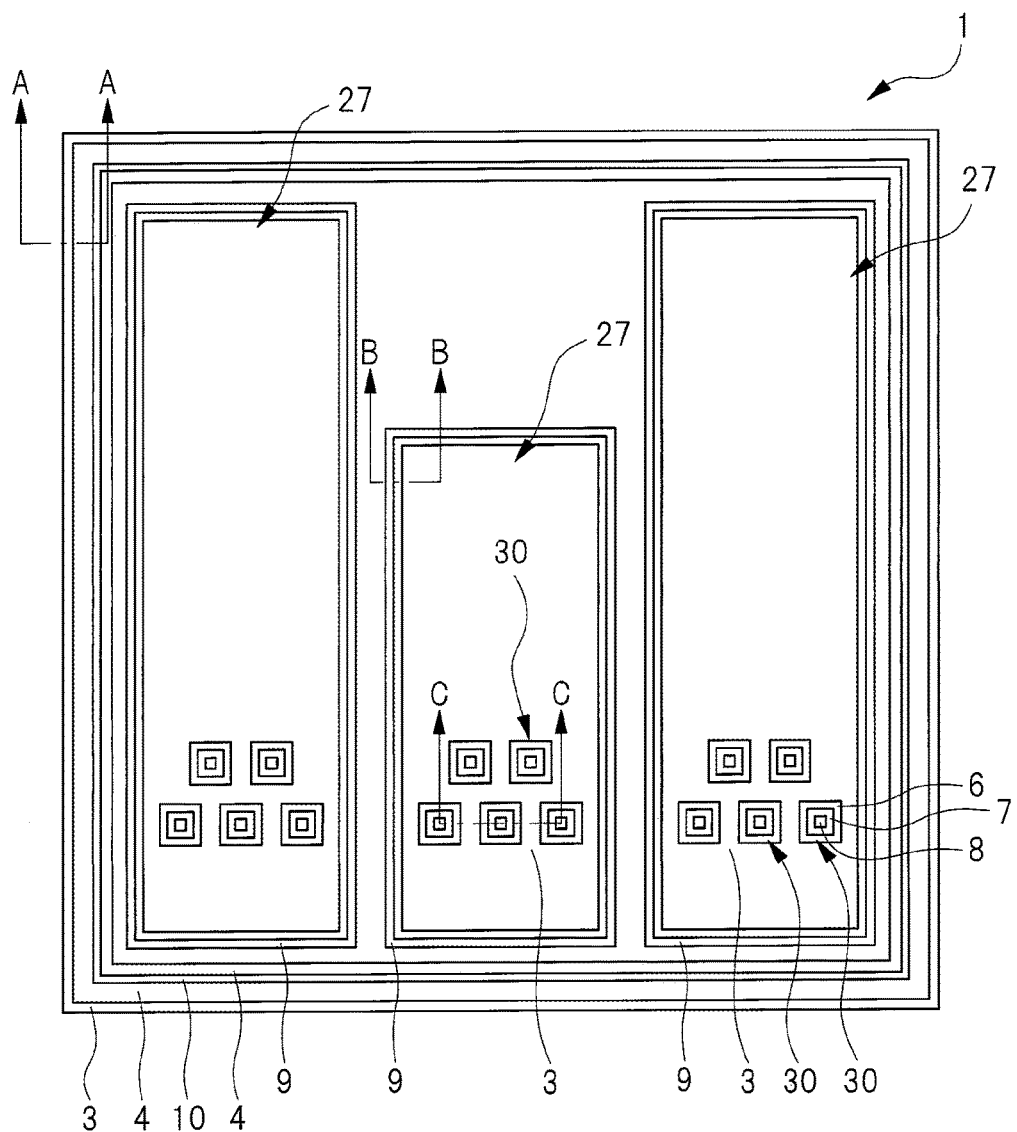
FIG. 2 is another plan view of the silicon carbide semiconductor device according to the first embodiment of the present invention.
Figure 3:
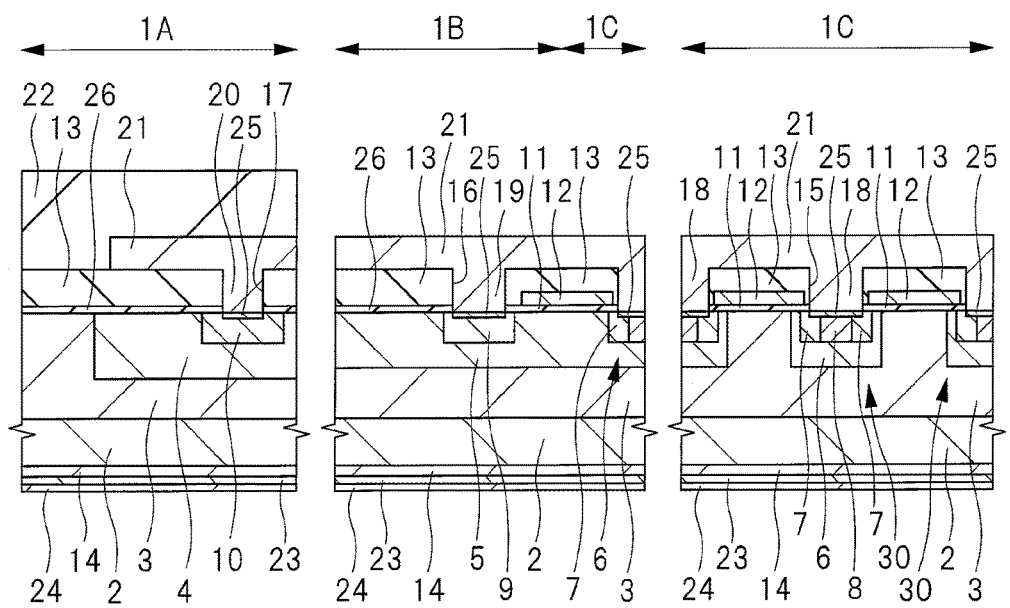
FIG. 3 is a cross-sectional view of the silicon carbide semiconductor device according to the first embodiment of the present invention.

Hereinafter, a structure of a SiC-MOSFET configuring a silicon carbide semiconductor device according to the present embodiment will be described with reference to FIGS. 1 to 4. FIGS. 1 and 2 are plan views of the silicon carbide semiconductor device according to the present embodiment. FIG. 2 shows a structure of a layer below electrode pads shown in FIG. 1. FIG. 3 is a cross-sectional view of the silicon carbide semiconductor device according to the present embodiment. FIG. 3 shows cross sections taken along line A-A, line B-B and line C-C of FIG. 2 from left to right, respectively.

As shown in FIG. 1, a shape of a semiconductor chip 1 is rectangular in plan view. A gate pad 28 which is an electrode pad to which a gate voltage from an external control circuit (not shown) is applied and a source pad 29 which is an electrode pad to which a source voltage from an external control circuit (not shown) is applied are formed on an upper surface of the semiconductor chip 1. A passivation film 22 is formed on the upper surface of the semiconductor chip 1 in a periphery of the gate pad 28 and the source pad 29. Note that, although the position and number of the gate pad 28 or the shape of the source pad 29 may vary, there is no influence on the effects of the silicon carbide-stacked substrate of the present embodiment.

As shown in FIG. 2, the semiconductor chip 1 has a semiconductor substrate constituted by: a SiC substrate (not shown) made of silicon carbide (SiC); and an epitaxial layer 3 formed over a main surface (upper surface) of the SiC substrate. FIG. 2 mainly shows an upper surface of the epitaxial layer 3, and illustrations of a silicide layer, a gate insulating film, a gate electrode, an interlayer insulating film, a contact plug, a passivation film, a pad and the like on the epitaxial layer are omitted. FIG. 2 shows the upper surface of the epitaxial layer 3 and various semiconductor regions formed on this upper surface.

A plurality of active regions (element regions) 27 are arranged below each of the above-described gate pad 28 and source pad 29 so as to be aligned in plan view (see FIG. 1). Here, three active regions 27 aligned on the upper surface (main surface) of the semiconductor substrate are shown; however, the number of active regions 27 may be less than or greater than three. In the case of a large-area chip, a leading wiring (not shown) for supplying power is necessary in order to uniformly supply power to a plurality of cells (unit cells 30). For this reason, the active regions 27 within the semiconductor chip 1 are divided into several regions, and each active region 27 is arranged apart from one another via a region in which the wiring for supplying power is arranged. In other words, the leading wiring for supplying power is arranged between adjacent active regions 27.

The plurality of unit cells 30 each serving as the smallest unit structure of a single MOSFET are arranged within each active region 27. In other words, the silicon carbide semiconductor device of the present embodiment has the semiconductor chip 1 on which a plurality of MOSFETs constituted by cell structures are mounted. The gate voltage applied to the gate pad 28 shown in FIG. 1 is supplied to a gate electrode (not shown) of each unit cell 30 via the gate pad 28. FIG. 2 shows only five unit cells 30 within each active region 27; however, each active region 27 actually comprises more unit cells 30.

In plan view, one unit cell 30 contains a rectangular first contact region 8, a source region 7 surrounding a periphery of the first contact region 8, and a p-type semiconductor region 6 surrounding a periphery of the source region 7. The plurality of unit cells 30 are arranged apart from one another on the upper surface of the epitaxial layer 3. Here, the unit cell 30 is shown as having a regular quadrilateral structure in plan view; however, the present invention is not limited to this structure, and the shape of the unit cell 30 may be, for example, rectangular or polygonal.

In addition, the plurality of unit cells 30 are arranged so as to be aligned in a first direction parallel to two parallel sides at end portions of the semiconductor chip 1, and these plurality of columns provided in such a manner are arranged in a second direction orthogonal to the first direction. Further, the unit cells 30 in the columns adjacent in the second direction are alternately arranged to one another so as to be shifted by half an interval in the first direction. However, the present invention is not limited to this alignment, and the plurality of unit cells 30 may be arranged with equal pitches between each other in vertical and horizontal directions. In other words, the plurality of unit cells 30 may be arranged in a matrix-like manner.

A $p^+$-type semiconductor region (second contact region) 9 surrounding the active region 27 is formed in a periphery of each active region 27. A relatively deep p-type semiconductor region 4 is formed in a peripheral portion on the upper surface of the semiconductor substrate so as to collectively surround all of the active regions 27. The p-type semiconductor region 4 serves as a JTE (Junction Termination Extension) region (termination region). A third contact region 10 for supplying power to the p-type semiconductor region 4 is formed on the upper surface of the p-type semiconductor region 4. Each of the p-type semiconductor region 4 and the third contact region 10 has a frame-like structure extending along each side of the rectangular semiconductor chip 1.

Here, as one of the main features of the present embodiment, the $p^+$-type semiconductor region 9 for flowing out holes in the semiconductor substrate is formed on the upper surface of the epitaxial layer 3 in the periphery of each active region 27 so as to surround each active region 27. In other words, each $p^+$-type semiconductor region 9 has a frame-like planar layout, and one active region 27 is arranged inside each frame-like $p^+$-type semiconductor region 9. The active region 27 has a rectangular layout and the $p^+$-type semiconductor region 9 is arranged so as to maintain a constant distance away from active region 27, so that the p-type semiconductor region 9 has a rectangular and frame-like layout. FIG. 2 shows three active regions 27, meaning that three $p^+$-type semiconductor regions 9 each surrounding the active regions 27 are also shown. The $p^+$-type semiconductor regions 9 may be formed so as to be in contact with the active regions 27 as long as the $p^+$-type semiconductor region 9 is not overlapping a gate electrode (not shown) and is not in contact with the first contact region 8 in plan view.

The left drawing in FIG. 3 shows a cross section of a structure of a termination region 1A at an end portion of the semiconductor chip 1 containing SiC (silicon carbide)-MOSFETs, taken along line A-A of FIG. 2. In other words, the cross section of the left drawing in FIG. 3 shows a peripheral portion of the semiconductor chip 1. In addition, the middle drawing in FIG. 3 shows a cross section of a structure in the vicinity of an end portion of an active region (element region) 1C of the semiconductor chip 1 containing SiC-MOSFETs, taken along line B-B of FIG. 2. In other words, the cross section of the middle drawing in FIG. 3 shows an end portion of the active region 1C of the semiconductor chip 1 and a hole outflow region 1B adjacent to the active region 1C and arranged in the periphery of the active region 1C. The active region 1C corresponds to the active region 27 shown in FIG. 2.

In addition, the right drawing in FIG. 3 shows a cross section of a structure of the active region 1C of the semiconductor chip 1 containing SiC-MOSFETs, taken along line C-C of FIG. 2. In other words, the cross section of the right drawing in FIG. 3 shows a cross section of the plurality of SiC-MOSFETs (hereinafter occasionally referred to simply as "MOSFET(s)") within the active region 1C of the semiconductor chip 1.

As shown in FIG. 3, the semiconductor chip 1 of the present embodiment (see FIG. 2) has a SiC substrate 2 which is an $n^+$-type hexagonal semiconductor substrate, and an epitaxial layer (semiconductor layer) 3 containing an $n^-$-type drift layer made of SiC having a lower impurity concentration than the SiC substrate 2 is formed over the SiC substrate 2. The epitaxial layer 3 is formed so as to be in contact with an upper surface of the SiC substrate 2. Cell structures of the plurality of n-channel type MOSFETs are formed on the upper surface of the epitaxial layer 3 within the active region 11C. This semiconductor substrate contains n-type impurities (such as nitrogen (N) or phosphorus (P)).

An n-type impurity concentration of the SiC substrate 2 ranges from, for example, $1\times10^{17}$ cm$^{-3}$ to $1\times10^{19}$ cm$^{-3}$, and an impurity concentration of the epitaxial layer 3 ranges from, for example, $1\times10^{14}$ cm$^{-3}$ to $1\times10^{17}$ cm$^{-3}$. In addition, a thickness of the epitaxial layer 3 ranges from, for example, 3 μm to 80 μm.

Further, a drain wiring electrode 24 for the above-described MOSFET is formed on a rear surface side opposite to the main surface of the semiconductor chip 1 (see FIG. 2). Specifically, a drain region 14 which is an $n^+$-type semiconductor region is formed on a rear surface of the SiC substrate 2, and a silicide layer 23 is formed so as to be in contact with a bottom surface of the drain region 14. In other words, the rear surface of the SiC substrate 2 is covered by the silicide layer 23. A bottom surface of the silicide layer 23, that is, the surface of the silicide layer 23 which is opposite to the SiC substrate 2 side, is covered by the drain wiring electrode 24.

The plurality of p-type semiconductor regions (p-well regions, p-type body regions) 6 each having a predetermined depth from the upper surface of the epitaxial layer 3 are formed within the active region 1C. Namely, the plurality of the p-type semiconductor regions 6 are formed in the epitaxial layer 3 including the upper surface of the epitaxial layer 3 so as to be aligned at predetermined intervals. Each p-type semiconductor region 6 is a region to which p-type impurities (such as aluminum (Al) or boron (B)) are implanted. The source region 7 which is an $n^+$-type semiconductor region is formed in each p-type semiconductor region 6 so as to have a predetermined depth from the upper surface of the epitaxial layer 3. The source region 7 is a semiconductor region to which n-type impurities (such as nitrogen (N) or phosphorus (P)) are implanted. An n-type impurity concentration of the source region 7 ranges from, for example, $1\times10^{18}$ cm$^{-3}$ to $1\times10^{20}$ cm$^{-3}$. A depth of the source region 7 ranges from 0.05 μm to 1.0 μm.

In addition, the first contact region 8 which is a $p^+$-type semiconductor region is formed in each p-type semiconductor region 6 so as to have a predetermined depth from the upper surface of the epitaxial layer 3. The first contact region 8 is a region provided for fixing a potential of the p-type semiconductor region 6 and has the same depth as the source region 7. The first contact region 8 is in contact with the p-type semiconductor region 6. The first contact region 8 is a semiconductor region to which p-type impurities (such as aluminum (Al) or boron (B)) are implanted. An impurity concentration of the first contact region 8 is greater than that of the p-type semiconductor region 6. The first contact region 8 is arranged so as to be sandwiched from both sides by the adjacent source region 7. In addition, a bottom surface of the first contact region 8, a bottom surface of the source region 7 and side surfaces of the source region 7 are covered by the p-type semiconductor region 6. A width of the first contact region 8 in a direction (transverse direction, horizontal direction) along the main surface of the semiconductor substrate ranges from, for example, 1.0 µm to 1.5 µm.

The plurality of unit cells 30 constituted by the p-type semiconductor region 6, the source region 7 and the first contact region 8 are formed on the upper surface of the epitaxial layer 3, and the unit cells 30 are arranged apart from one another. A gate electrode 12 is formed on a portion of the epitaxial layer 3 that is between adjacent unit cells 30 via a gate insulating film 11. An upper surface of an end portion of the gate insulating film 11 and side and upper surfaces of the gate electrode 12 are covered by an interlayer insulating film 13. The first contact region 8 and a portion of the source region 7 at an opening formed in the interlayer insulating film 13 covering each gate electrode 12 are not covered by the gate insulating film 11, the gate electrode 12 and the interlayer insulating film 13. In other words, a stacked film constituted by the gate insulating film 11, the gate electrode 12 and the interlayer insulating film 13 is provided with an opening (through hole) that reaches an upper surface of the unit cell 30, and the first contact region 8 and the source region 7 in a bottom portion of this opening are exposed through the stacked film.

A silicide layer 25 is formed over the surface of the portion of the source region 7 and the first contact region 8 exposed through the above-described stacked film in the bottom portion of the opening 15, that is, a contact hole, in the interlayer insulating film 13 within the active region 1C. Namely, the first contact region 8 and the source region 7 are in contact with each other, and the silicide layer 25 is formed over an upper surface of the first contact region 8 and an upper surface of the source region 7 so as to extend over a boundary between the first contact region 8 and the source region 7. The silicide layer 25 has a rectangular structure in plan view and is arranged so as to cover a portion of the upper surface of the source region 7 and the entire upper surface of the first contact region 8.

A contact plug (conductive connecting portion) 18 is embedded in each opening 15 above the silicide layer 25 that is in contact with a portion of the source region 7 and the first contact region 8. The plurality of the contact plugs 18 embedded in the plurality of the openings 15 are integral with a source wiring electrode 21 formed on the interlayer insulating film 13. The source wiring electrode 21 is electrically connected to the source pad 29 (see FIG. 1). In other words, the source regions 7 of the plurality of MOSFETs formed in the semiconductor chip 1 are electrically connected in parallel to one another and are further connected to the source pad 29. Here, an upper surface of the source wiring electrode 21 exposed through the passivation film 22 described below configures the source pad 29.

The portion of the source region 7 and the first contact region 8 are electrically connected and are in ohmic contact with the contact plug 18 via the silicide layer 25. Thus, the portion of the source region 7 and the first contact region 8 are connected to the source pad 29 via conductors such as the silicide layer 25, the contact plug 18 and the source wiring electrode 21. Likewise, a contact plug is connected to the gate electrode 12 in a region not shown, and the gate electrode 12 is electrically connected to the gate pad 28 via this contact plug and a gate wiring electrode (see FIG. 1).

The interlayer insulating film 13 and the source wiring electrode 21 within the termination region 1A are covered by the passivation film 22. In contrast, an upper surface of the source wiring electrode 21 within the active region 1C is exposed through the passivation film 22. An upper surface of the gate wiring electrode connected to the gate electrode 12 is exposed through the passivation film 22 at a portion of a region (not shown) of the active region 1C and configures the gate pad 28 (see FIG. 1).

The MOSFET (MOS-type field effect transistor) formed in the semiconductor chip of the present embodiment has at least the gate electrode 12, the source region 7 and the drain region 14. When operating the MOSFET, a predetermined voltage is applied to the gate electrode 12 to turn on the MOSFET, so that a current flows from a high potential drain to a low potential source. A channel region of this MOSFET is formed in an upper portion of the p-type semiconductor region 6. In other words, a current for driving the MOSFET flows from the drain wiring electrode 24, passes through a region in the vicinity of the gate insulating film 11 in the epitaxial layer 3, further passes through a region directly below the gate electrode 12 in the p-type semiconductor region 6 in the vicinity of the upper surface of the epitaxial layer 3, and flows to the source region 7.

The p-type semiconductor region 4 is formed within the termination region 1A so as to have a predetermined depth from the upper surface of the epitaxial layer 3. In addition, the third contact region 10 which is a p*-type semiconductor region is formed within the termination region 1A so as to have a predetermined depth from the upper surface of the p-type semiconductor region 4 which is the upper surface of the epitaxial layer 3. The third contact region 10 and the p-type semiconductor region 4 are semiconductor regions to which p-type impurities (such as aluminum (Al) or boron (B)) are implanted. An impurity concentration of the third contact region 10 is greater than that of the p-type semiconductor region 4.

The p-type semiconductor region 4 is formed so as to be deeper than the third contact region 10, and the third contact region 10 is formed in the p-type semiconductor region 4. In other words, bottom and side surfaces of the third contact region 10 are covered by the p-type semiconductor region 4. Namely, the p-type semiconductor region 4 and the third contact region 10 formed to have a depth that is shallower than the p-type semiconductor region 4 are formed on the upper surface of the epitaxial layer 3 within the termination region 1A. The depth of the third contact region 10 is, for example, equal to a depth of each of the first contact region 8 and the source region 7.

The third contact region 10 is a region formed for fixing a potential of the p-type semiconductor region 4 and is a region for supplying a potential to the p-type semiconductor region 4. In other words, by applying a potential to the p-type semiconductor region 4 via the third contact region 10, it is possible to alleviate an electric field concentration at an end region that occurs when a reverse voltage is applied and maintain a high breakdown voltage of the semiconductor chip. Here, a structure in which the p-type semiconductor region 4 which is the JTE region is formed is described as an example of a termination structure of the semiconductor chip; however, the termination structure for alleviating the electric field concentration of the semiconductor chip may be, for example, an FLR (Field Limiting Ring) structure or the like having a plurality of p-type semiconductor regions that surround element regions in plan view.

The interlayer insulating film 13 is formed over the epitaxial layer 3 via an insulating film 26 except for a region of a portion of an upper surface of the third contact region 10 within the termination region 1A. The interlayer insulating film 13 and the insulating film 26 within the termination region 1A are provided with an opening (through hole) 17, and a portion of the upper surface of the third contact region 10 is exposed through the interlayer insulating film 13 and the insulating film 26 in a bottom portion of the opening 17.

A contact plug (conductive connecting portion) 20 is embedded in the opening 17 in the interlayer insulating film 13 within the termination region 1A, and the silicide layer 25 is formed over a bottom surface of the opening 17. In other words, the upper surface of the third contact region 10 is connected to the contact plug 20 in the bottom portion of the opening 17 via the silicide layer 25. The third contact region 10 is electrically connected to and is in ohmic contact with the contact plug 20 via the silicide layer 25. The contact plug 20 is integral with the source wiring electrode 21 on the interlayer insulating film 13.

Next, a structure in the vicinity of the end portion of the active region 1C shown in the middle drawing of FIG. 3 will be described. One of the main features of the present embodiment is that the p$^+$-type semiconductor region 9 is formed within a region adjacent to the end portion of the active region 1C so as to have a predetermined depth from an upper surface of the epitaxial layer 3. Namely, the p-type semiconductor region 5 is formed on the upper surface of the epitaxial layer 3 in the vicinity of the end portion of the active region 1C, and the p$^+$-type semiconductor region 9 is formed on an upper surface of the p-type semiconductor region 5 within the hole outflow region 1B adjacent to the end portion of the active region 1C. In other words, the bottom and side surfaces of the p$^+$-type semiconductor region 9 are covered by the p-type semiconductor region 5.

The hole outflow region 1B is a frame-like region surrounding each active region 1C present on the main surface of the semiconductor chip in plan view. Likewise, the p$^+$-type semiconductor region 9 is a frame-like region surrounding each active region 1C in plan view. A depth of the p$^+$-type semiconductor region 9 is equal to those of the first contact region 8 and the third contact region 10. In other words, the p$^+$-type semiconductor region 9 is formed shallower than the p-type semiconductor region 5 and 6. The p$^+$-type semiconductor region 9 is formed apart from the first contact region 8 and the source region 7 within the active region 1C. In addition, the p$^+$-type semiconductor region 9 is formed apart from the p-type semiconductor region 4 and the third contact region 10. The p-type semiconductor region 5 and the p$^+$-type semiconductor region 9 are semiconductor regions to which p-type impurities (such as aluminum (Al) or boron (B)) are implanted.

The p-type semiconductor regions 5 and 6 have the same impurity concentrations as each other. A depth of the p-type semiconductor region 4 is, for example, greater than 0.5 μm and is less than or equal to 2.0 μm. In addition, a depth of each of the p-type semiconductor regions 5 and 6 ranges from, for example, 0.5 μm to 1.5 μm. However, the depth of the p-type semiconductor region 4 is greater than those of the p-type semiconductor regions 5 and 6. Namely, the p-type semiconductor region 4 which is a termination region plays a role in alleviating electric field concentration at a peripheral portion (end region) of the semiconductor chip and maintaining a high breakdown voltage, and in order to exert such an effect, the p-type semiconductor region 4 needs to be formed so as to be deeper than each of the p-type semiconductor regions 5 and 6.

A width of each side of the p$^+$-type semiconductor region 9 in the transverse direction, that is, a width in the lateral direction, is greater than 1.5 μm and is less than or equal to 10 μm. Namely, a minimum width of the p$^+$-type semiconductor region 9 is greater than the width of the first contact region 8. Increasing the width of the p$^+$-type semiconductor region 9 in such a manner increases efficiency in flowing out the holes through the p$^+$-type semiconductor region 9. As long as the width of the p$^+$-type semiconductor region 9 is less than or equal to 10 μm, an area of a region between the active regions 1C can be prevented from increasing. Namely, an area of the active region 1C can be prevented from decreasing, and an area of the semiconductor chip can be prevented from increasing.

An impurity concentration of each of the first contact region 8, the third contact region 10 and the p$^+$-type semiconductor region 9 is greater than the impurity concentration of each of the p-type semiconductor regions 4 to 6. A p-type impurity concentration of each of the p-type semiconductor regions 3 to 5 ranges from, for example, $1\times10^{-3}$ cm$^{-3}$ to $1\times10^{19}$ cm$^{-3}$. A p-type impurity concentration of each of the first contact region 8, the third contact region 10 and the p$^+$-type semiconductor region 9 ranges from, for example, $1\times10^{18}$ cm$^{-3}$ to $1\times10^{20}$ cm$^{-3}$. In addition, a depth of each of the first contact region 8, the third contact region 10 and the p$^+$-type semiconductor region 9 ranges from 0.05 μm to 1.0 μm.

The shortest distance between the p$^+$-type semiconductor region 9 and the first contact region 8 within the active region 1C ranges from 2.0 μm to 20 μm. This means that the shortest distance is the distance between the p$^+$-type semiconductor region 9 and the first contact region 8 located at the endmost portion of the active region 1C. It is technically difficult to form these semiconductor regions at a distance closer than 2.0 μm, and attempting to form the semiconductor regions at a distance closer than 2.0 μm may possibly cause a short circuit to occur between the semiconductor regions. In addition, as long as the distance between these semiconductor regions is less than or equal to 20 μm, the p$^+$-type semiconductor regions 9 can be formed without increasing the distance between the active regions 1C on the upper surface of the semiconductor chip. Further, when the distance between these semiconductor regions is greater than 20 μm, it is difficult for the holes accumulated in the semiconductor substrate in the vicinity of the end portion of the active region 1C to flow out through the p$^+$-type semiconductor region 9.

The p-type semiconductor region 5 is continuously formed from inside the active region 1C and extends through the hole outflow region 1B. The p-type semiconductor region 5 within the active region 1C configures the p-type semiconductor region 6. As described below, the p$^+$-type semiconductor region 9 is a contact region formed for flowing out the holes accumulated in a periphery of the active region 1C during a recovery operation of the body diode having the MOSFET.

The gate electrode 12 and the interlayer insulating film 13 are formed on the upper surface of the epitaxial layer 3 between the end portion of the active region 1C and the endmost unit cell 30 among the plurality of unit cells 30 arranged within the active region 1C via the gate insulating film 11. The gate insulating film 11, the gate electrode 12 and the interlayer insulating film 13 are continuously formed from inside the active region 1C and extend through a portion of the hole outflow region 1B, and the gate electrode 12 terminates within the hole outflow region 1B. The p+-type semiconductor region 9 is formed outside the active region 1C and the gate electrode 12 in plan view. In other words, the p+-type semiconductor region 9 and the gate electrode 12 are arranged apart from each other and do not overlap each other in plan view.

In other words, the p+-type semiconductor region 9 is not formed directly under the gate electrode 12. This is because the region where the p+-type semiconductor region 9 is formed is a high concentration region in which a large number of p-type impurities are implanted to the upper surface of the epitaxial layer 3 and causes a morphology of the upper surface of the epitaxial layer 3 to deteriorate, and thus, reliability of the gate insulating film 11 formed on this upper surface needs to be prevented from decreasing. In other words, the upper surface of the p+-type semiconductor region 9 is subject to damage by ion-implantation and is rougher than the upper surface of the p-type semiconductor region 5 which is a low concentration region in a periphery of the p+-type semiconductor region 9. Thus, in the case where the gate electrode 12 is formed on the upper surface of the p+-type semiconductor region 9 via the gate insulating film 11, reliability of the gate insulating film 11 decreases as compared with a case where the gate electrode 12 is formed on the upper surface of the p-type semiconductor region 5 via the gate insulating film 11.

For this reason, the gate electrode 12 is not formed directly above the p+-type semiconductor region 9. Hence, dielectric breakdown between the p+-type semiconductor region 9 and the gate electrode 12 can be prevented from occurring. Thus, reliability of the silicon carbide semiconductor device can be improved.

An opening (through hole) 16 penetrating the interlayer insulating film 13 is formed directly above the p+-type semiconductor region 9 within the hole outflow region 1B. The opening 15 is an island-like hole in plan view, whereas each of the openings 16 and 17 is a trench extending in a direction perpendicular to the drawing plane of FIG. 3. Among the side surfaces of the opening 16, the side surface closer to the active region 1C is constituted by the gate insulating film 11 and the interlayer insulating film 13 formed over this gate insulating film 11, and the side surface facing the active region 1C is constituted by the insulating film 26 and the interlayer insulating film 13 formed over this insulating film 26. In other words, the gate electrode 12 is not exposed on the side surfaces of the opening 16, and the interlayer insulating film 13 is interposed between the gate electrode 12 and the opening 16.

A portion of the upper surface of the p+-type semiconductor region 9 is exposed through the interlayer insulating film 13, the gate insulating film 11 and the insulating film 26 in a bottom portion of the opening 16. A contact plug (conductive connecting portion) 19 is embedded in the opening 16, and the silicide layer 25 is formed over a bottom surface of the opening 16. In other words, the upper surface of the p+-type semiconductor region 9 is connected to the contact plug 19 in the bottom portion of the opening 16 via the silicide layer 25. The p+-type semiconductor region 9 is electrically connected to and is in ohmic contact with the contact plug 19 via the silicide layer 25. The contact plug 19 is integral with the source wiring electrode 21 formed on the interlayer insulating film 13.

The contact plugs 18, 19 and 20 and the source wiring electrode 21 are integral with one another and are made of a single metal film. Therefore, the first contact region 8 is electrically connected to the source pad 29 (see FIG. 1) via the silicide layer 25, the contact plug 18 and the source wiring electrode 21. Likewise, the p+-type semiconductor region 9 is electrically connected to the source pad 29 via the silicide layer 25, the contact plug 19 and the source wiring electrode 21. Similarly, the third contact region 10 is electrically connected to the source pad 29 via the silicide layer 25, the contact plug 20 and the source wiring electrode 21.

Figure 4:
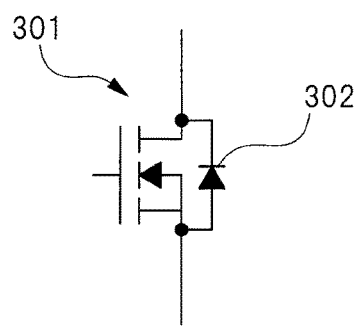
FIG. 4 is a circuit diagram of the silicon carbide semiconductor device according to the first embodiment of the present invention.

FIG. 4 is a circuit diagram of the SiC-MOSFET according to the present embodiment. As shown in FIG. 4, the SiC-MOSFET 301 has the body diode 302 connected in anti-parallel between a source and a drain. Namely, the SiC-MOSFET 301 is an element through which a current flows in a forward direction from the drain to the source when in an ON state. On the other hand, an anode of the body diode 302 is connected to the source of the SiC-MOSFET 301, and a cathode of the body diode 302 is connected to the drain of the SiC-MOSFET 301. In other words, the SiC-MOSFET 301 and the body diode 302 are connected in parallel such that the direction in which a current flows through the body diode 302 and the direction in which a current flows through the SiC-MOSFET 301 in are reverse to each other. Here, such a connection relation is referred to as "anti-parallel".

Here, the body diode of the MOSFET refers to a p-n junction portion between, for example, the p-type semiconductor region 6 connected to the p+-type first contact region 8 and the n-type epitaxial layer 3 shown in FIG. 3. In addition, a body diode within the termination region 1A refers to a p-n junction portion between, for example, the p-type semiconductor region 4 connected to the p+-type third contact region 10 and the n-type epitaxial layer 3. Further, a body diode within the hole outflow region 1B refers to a p-n junction portion between, for example, the p-type semiconductor region 5 connected to the p+-type semiconductor region 9 and the n-type epitaxial layer 3. In other words, a p-type layer constituted by the p+-type semiconductor region 9 and the p-type semiconductor region 5 and an n-type layer constituted by the n-type epitaxial layer 3 and the SiC substrate 2 configure the body diode.

<Manufacturing Method of Silicon Carbide Semiconductor Device>

A manufacturing method of the silicon carbide semiconductor device according to the present embodiment will be described in the order of the steps with reference to FIGS. 5 to 14. Each of FIGS. 5 to 14 is a cross-sectional view for describing a manufacturing step of the silicon carbide semiconductor device according to the present embodiment. The left drawing in each of FIGS. 5 to 14 shows a cross section of the termination region 1A which is a peripheral region of the silicon carbide semiconductor device, the middle drawing shows cross sections of the end portion of the active region 1C in which MOSFETs are formed and the hole outflow region 1B, and the right drawing shows a cross section of a center portion of the active region 1C.

Figure 5:
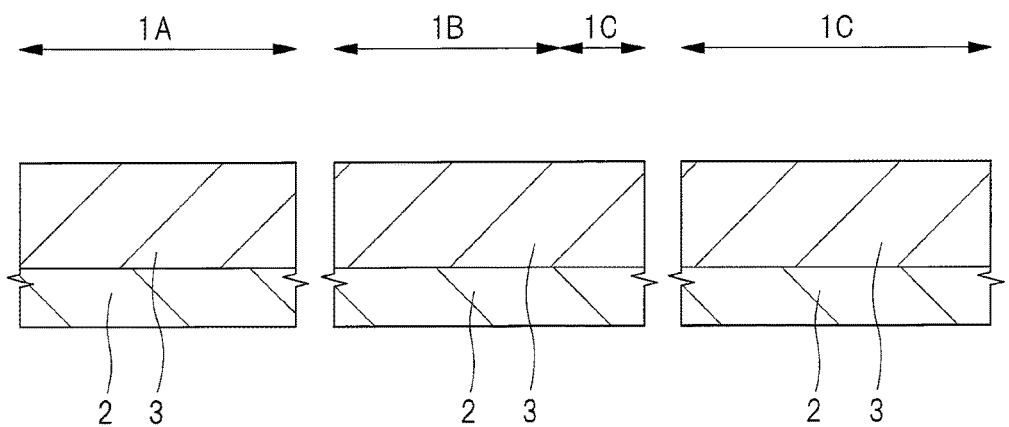
FIG. 5 is a cross-sectional view of the silicon carbide semiconductor device according to the first embodiment of the present invention in a manufacturing step.

First, as shown in FIG. 5, the n+-type SiC substrate 2 is prepared. N-type impurities having a relatively high concentration are implanted to the SiC substrate 2. The n-type impurities are, for example, nitrogen (N), and this n-type impurity concentration ranges from, for example, $1 \times 10^{17}$ cm$^{-3}$ to $1 \times 10^{19}$ cm$^{-3}$. A main surface of the SiC substrate 2 is, for example, a {0001} plane.

Next, the epitaxial layer 3 which is an n−-type semiconductor layer of SiC is formed over the main surface of the SiC substrate 2 by an epitaxial growth method. N-type impurities (such as nitrogen (N)) having a lower impurity concentration than the SiC substrate 2 are implanted to the epitaxial layer 3. An impurity concentration of the epitaxial layer 3 depends on a rated breakdown voltage of the element and ranges from, for example, $1 \times 10^{14}$ cm$^{-3}$ to $1 \times 10^{17}$ cm$^{-3}$. In addition, a thickness of the epitaxial layer 3 ranges from, for example, 3 μm to 80 μm.

Figure 6:
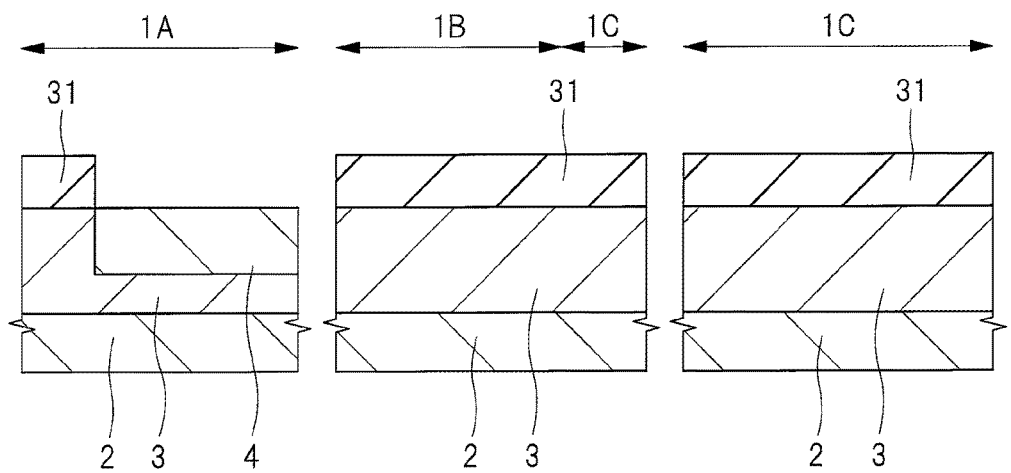
FIG. 6 is a cross-sectional view of the silicon carbide semiconductor device in a manufacturing step continued from FIG. 5.

Next, as shown in FIG. 6, a mask 31 is formed over the upper surface of the epitaxial layer 3. The mask 31 is a film for exposing a portion of the upper surface of the epitaxial layer 3 within the termination region 1A. In other words, the mask 31 covers the active region 1C and the hole outflow region 1B. A thickness of the mask 31 ranges from, for example, approximately 0.5 μm to 5.0 μm. A material used for the mask 31 is, for example, SiO$_2$ (silicon dioxide), a photoresist or the like.

Next, p-type impurities (such as aluminum (Al)) are ion-implanted to the upper surface of the epitaxial layer 3 on which the mask 31 is formed. Hence, the p-type semiconductor region 4 which is a p-type semiconductor region in a crystalline state is formed on the upper surface of the epitaxial layer 3 within the termination region 1A. A depth of the p-type semiconductor region 4 from the upper surface of the epitaxial layer 3 is, for example, greater than 0.5 μm and less than or equal to 2.0 μm. In addition, an impurity concentration of the p-type semiconductor region 4 ranges from, for example, $1 \times 10^{16}$ cm$^{-3}$ to $5 \times 10^{19}$ cm$^{-3}$.

Figure 7:
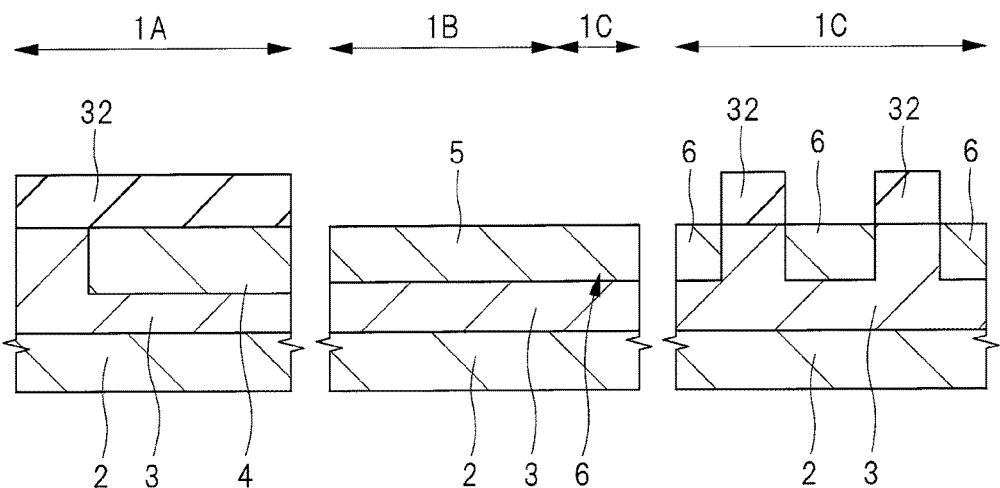
FIG. 7 is a cross-sectional view of the silicon carbide semiconductor device in a manufacturing step continued from FIG. 6.

Next, as shown in FIG. 7, after the mask 31 is removed, a mask 32 is formed over the upper surface of the epitaxial layer 3. The mask 32 is a film for exposing a plurality of portions of the upper surface of the epitaxial layer 3 within the active region 1C. A thickness of the mask 32 ranges from, for example, approximately 1.0 μm to 5.0 μm. A material used for the mask 32 is, for example, SiO$_2$, a photoresist or the like. The mask 32 is a film for covering the termination region 1A, for exposing the hole outflow region 1B and for exposing the plurality of portions within the active region 1C.

Next, p-type impurities (such as aluminum (Al)) are ion-implanted to the upper surface of the epitaxial layer 3 on which the mask 32 is formed. Hence, the plurality of p-type semiconductor regions 6 which are body regions (well regions) are formed on the upper surface of the epitaxial layer 3 within the active region 1C, and the p-type semiconductor region 5 which is a body region is formed on the upper surface of the epitaxial layer 3 so as to extend from the end portion of the active region 1C through the hole outflow region 1B. A depth of each of the p-type semiconductor regions 5 and 6 from the upper surface of the epitaxial layer 3 ranges from, for example, approximately 0.5 μm to 1.5 μm. In addition, an impurity concentration of the p-type semiconductor region 6 ranges from, for example, $1 \times 10^{16}$ cm$^{-3}$ to $1 \times 10^{19}$ cm$^{-3}$. The depth of each of the p-type semiconductor regions 5 and 6 is shallower than that of the p-type semiconductor region 4. In addition, the p-type semiconductor region 5 has a frame-like pattern surrounding the active region 1C in plan view. Note that the p-type semiconductor region 5 and the p-type semiconductor region 6 within the active region 1C are integral with each other.

Figure 8:
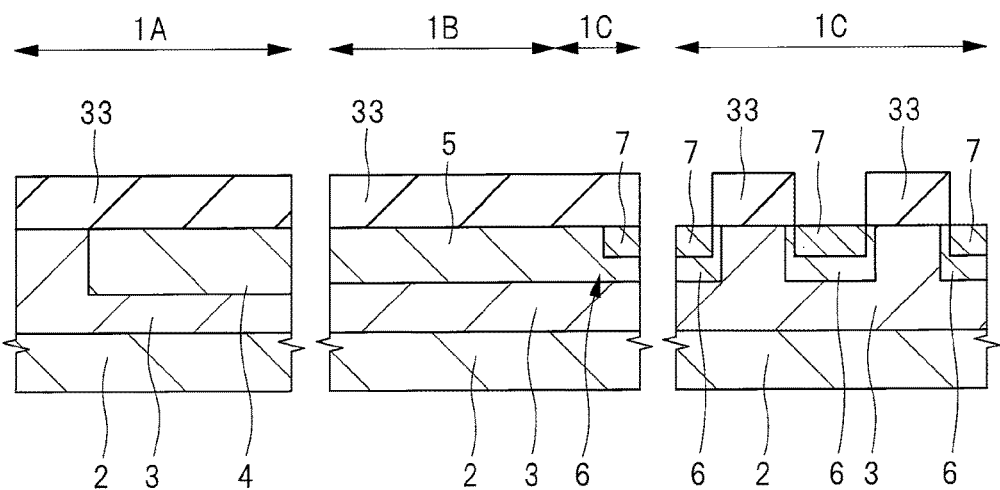
FIG. 8 is a cross-sectional view of the silicon carbide semiconductor device in a manufacturing step continued from FIG. 7.

Next, as shown in FIG. 8, after the mask 32 is removed, a mask 33 is formed over the upper surface of the epitaxial layer 3. A thickness of the mask 33 ranges from, for example, approximately 0.5 μm to 2.0 μm. A material used for the mask 33 is, for example, SiO$_2$, a photoresist or the like. The mask 33 is a film for covering the termination region 1A and the hole outflow region 1B and for exposing a plurality of portions within the active region 1C.

Next, n-type impurities (such as nitrogen (N)) are ion-implanted to the upper surface of the epitaxial layer 3 on which the mask 33 is formed. Hence, the plurality of source regions 7 which are n$^+$-type semiconductor regions are formed on the upper surface of the epitaxial layer 3 within the active region 1C. An n-type impurity concentration of each source region 7 ranges from, for example, $1 \times 10^{18}$ cm$^{-3}$ to $1 \times 10^{21}$ cm$^{-3}$. Each source region 7 is formed at a center portion of the p-type semiconductor region 6 in plan view. A depth of each source region 7 from the upper surface of the epitaxial layer 3 ranges from, for example, approximately 0.05 μm to 1.0 μm.

Figure 9:
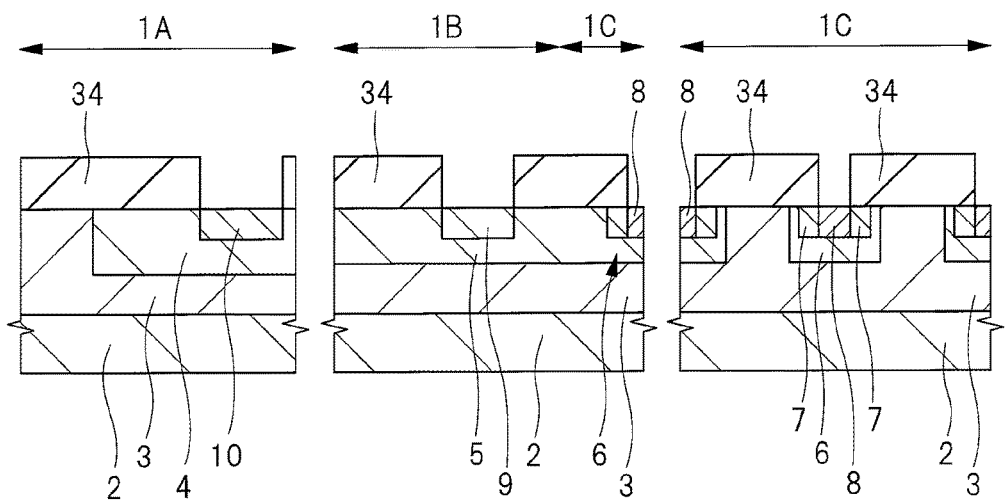
FIG. 9 is a cross-sectional view of the silicon carbide semiconductor device in a manufacturing step continued from FIG. 8.

Next, as shown in FIG. 9, after the mask 33 is removed, a mask 34 is formed over the upper surface of the epitaxial layer 3. A thickness of the mask 34 ranges from, for example, approximately 0.5 μm to 2.0 μm. A material used for the mask 34 is, for example, SiO$_2$, a photoresist or the like. The mask 34 is a film for exposing portions of each of the termination region 1A, the hole outflow region 1B and the active region 1C. A center portion of the upper surface of the source region 7 within the active region 1C is exposed in a bottom portion of an opening in the mask 34. End portions of the upper surface of the source region 7 surrounding the center portion are covered by the mask 34.

Next, p-type impurities (such as aluminum (Al)) are ion-implanted to the epitaxial layer 3 on which the mask 34 is formed. Hence, the plurality of first contact regions 8 which are p$^+$-type semiconductor regions are formed on the upper surface of the epitaxial layer 3 within the active region 1C, the third contact region 10 which is a p$^+$-type semiconductor region is formed on the upper surface of the p-type semiconductor region 4 within the termination region 1A, and the p$^+$-type semiconductor region 9 is formed on the upper surface of the p-type semiconductor region 5 within the hole outflow region 1B.

The p$^+$-type semiconductor region 9 has a frame-like pattern surrounding the active region 1C. Each first contact region 8 is formed in a center portion of each source region 7 in plan view. The third contact region 10 is formed on the upper surface of the p-type semiconductor region 4. A depth of each of the p$^+$-type semiconductor region 9, the first contact region 8 and the third contact region 10 from the upper surface of the epitaxial layer 3 ranges from, for example, approximately 0.05 μm to 1.0 μm. Namely, a depth of each of the p$^+$-type semiconductor region 9, the first contact region 8 and the third contact region 10 is shallower than a depth of each of the p-type semiconductor regions 4 to 6.

A p-type impurity concentration of each of the p$^+$-type semiconductor region 9, the first contact region 8 and the third contact region 10 ranges from, for example, $1 \times 10^{18}$ cm$^{-3}$ to $1 \times 10^{21}$ cm$^{-3}$. Specifically, this concentration is $1 \times 10^{20}$ cm$^{-3}$.

Figure 10:
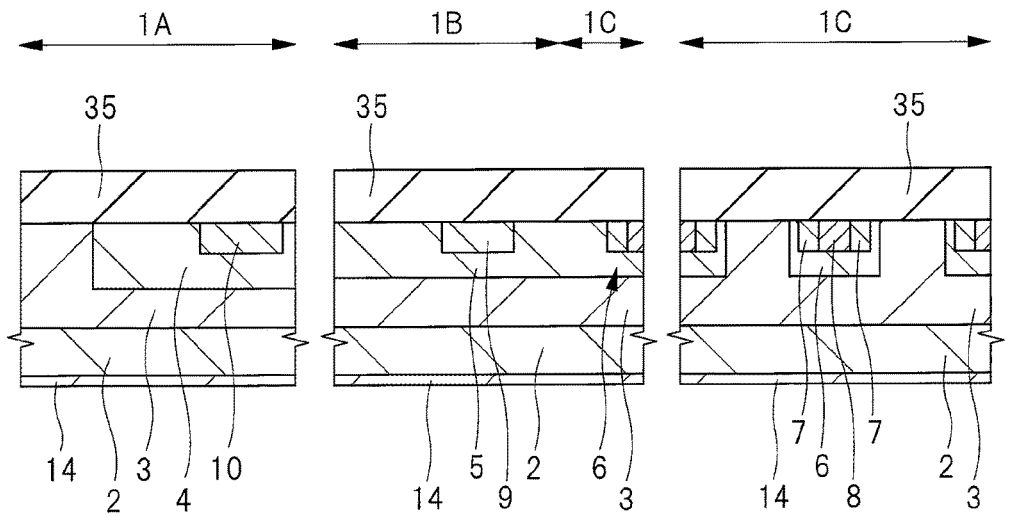
FIG. 10 is a cross-sectional view of the silicon carbide semiconductor device in a manufacturing step continued from FIG. 9.

Next, as shown in FIG. 10, after the mask 34 is removed, a mask 35 serving as a protective film is formed over the upper surface of the epitaxial layer 3. Thereafter, n-type impurities (such as nitrogen (N)) are ion-implanted to the rear surface of the SiC substrate 2. Hence, the drain region 14 which is an n$^+$-type semiconductor region is formed over the rear surface of the SiC substrate 2. An impurity concentration of the drain region 14 ranges from $1 \times 10^{19}$ cm$^{-3}$ to $1 \times 10^{21}$ cm$^{-3}$. A depth of the drain region 14 from the rear surface of the SiC substrate 2 ranges from, for example, approximately 0.05 μm to 2.0 μm.

Next, although not shown, the entire mask is removed, and a carbon film is deposited by using, for example, a plasma-enhanced CVD (Chemical Vapor Deposition) process so as to cover each of the upper surface of the epitaxial layer 3 and the rear surface of the SiC substrate 2. A thickness of the carbon film ranges from, for example, approximately 0.03 μm to 0.05 μm. Thereafter, heat treatment is performed at a temperature of 1500° C. or more for approximately 2 to 3 minutes. Hence, activation of the impurities ion-implanted to the upper surface of the epitaxial layer 3 and the rear surface of the SiC substrate 2 is performed. Thereafter, the above-described carbon film is removed by, for example, a plasma-enhanced process.

Figure 11:
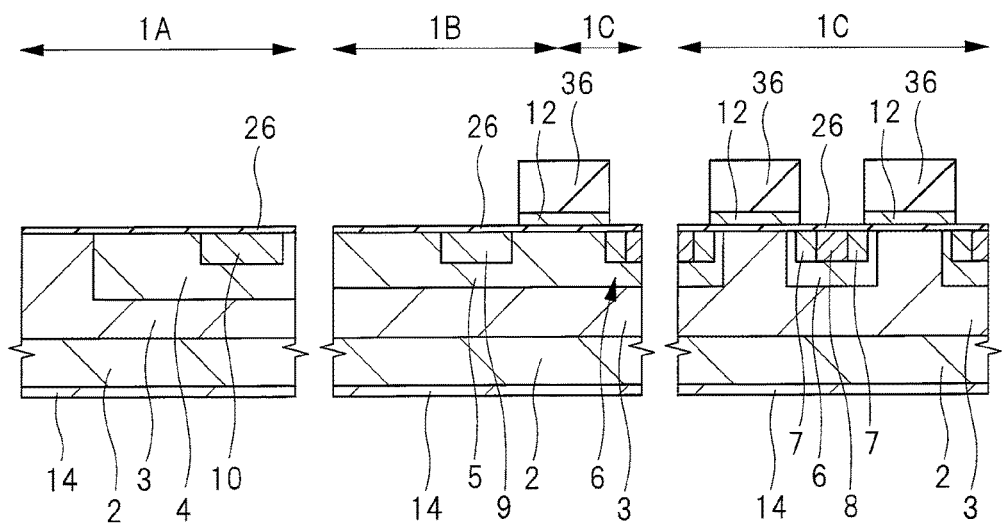
FIG. 11 is a cross-sectional view of the silicon carbide semiconductor device in a manufacturing step continued from FIG. 10.

Next, as shown in FIG. 11, after the insulating film 26 and an n-type poly-Si (silicon) film are formed over the upper surface of the epitaxial layer 3 in this order, a mask 36 is formed over the poly-Si film. The insulating film 26 and the poly-Si film are formed by, for example, the CVD process. The mask 36 is formed between adjacent first contact regions 8 in the upper surface of the epitaxial layer 3 within the active region 1C. The mask 36 continuously formed from inside the active region 1C is formed within the hole outflow region 1B. However, the mask 36 is arranged apart from the p$^+$-type semiconductor region 9 in plan view, and the mask 36 and the p$^+$-type semiconductor region 9 do not overlap each other. In other words, the mask 36 within the hole outflow region 1B is formed between the p$^+$-type semiconductor region 9 and the active region 1C. The mask 36 is not formed within the termination region 1A in plan view.

Subsequently, the poly-Si film is processed by a dry etching process using the mask 36. Hence, the gate electrode 12 constituted by the poly-Si film is formed within the active region 1C and a portion of the hole outflow region 1B. A thickness of the insulating film 26 ranges from, for example, approximately 0.05 μm to 0.15 μm. A thickness of the gate electrode 12 ranges from, for example, approximately 0.2 μm to 0.5 μm. The entire poly-Si film within the termination region 1A is removed, so that an upper surface of the insulating film 26 is exposed. The entire poly-Si film directly above the p$^+$-type semiconductor region 9 is removed, and no gate electrode 12 is formed on this portion.

Figure 12:
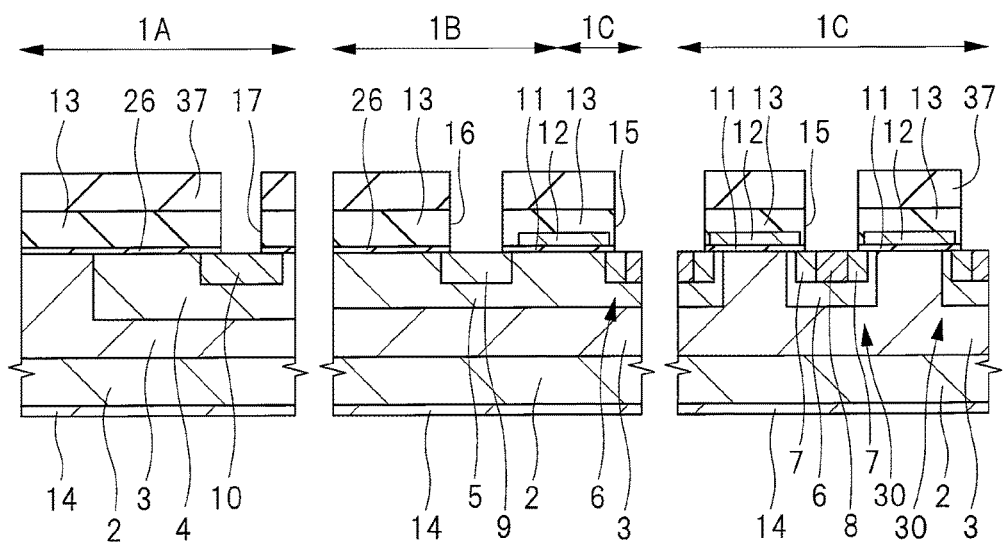
FIG. 12 is a cross-sectional view of the silicon carbide semiconductor device in a manufacturing step continued from FIG. 11.

Next, as shown in FIG. 12, after the mask 36 is removed, the interlayer insulating film 13 is formed over the upper surface of the epitaxial layer 3 by, for example, the plasma-enhanced CVD process so as to cover the gate electrode 12 and the insulating film 26. Thereafter, the interlayer insulating film 13 and the insulating film 26 are processed by the dry etching process with using a mask 37, so that the upper surface of the epitaxial layer 3 is exposed. Hence, the gate insulating film 11 constituted by the insulating film 26 is formed directly under the gate electrode 12 and the interlayer insulating film 13 within the active region 1C.

By the above-described etching process, the opening 15 exposing an upper surface of each of a portion of the source region 7 and the first contact region 8 is formed in the interlayer insulating film 13 within the active region 1C. In addition, by the above-described etching process, the opening 16 exposing a portion of the upper surface of the p$^+$-type semiconductor region 9 is formed in the interlayer insulating film 13 within the hole outflow region 1B, and the opening 17 exposing a portion of the upper surface of the third contact region 10 in the bottom portion of the opening 17 is formed in the interlayer insulating film 13 within the termination region 1A. Further, an opening (not shown) reaching the gate electrode 12 is also formed in this process.

In this manner, the plurality of unit cells 30 each serving as the smallest unit structure of a single MOSFET are formed within the active region 1C. Each unit cell 30 shown in FIG. 13 has the p-type semiconductor region 6, the source region 7 and the first contact region 8 adjacent to one another, and the gate electrode 12 formed directly above a portion of the p-type semiconductor region 6 via the gate insulating film 11.

Figure 13:
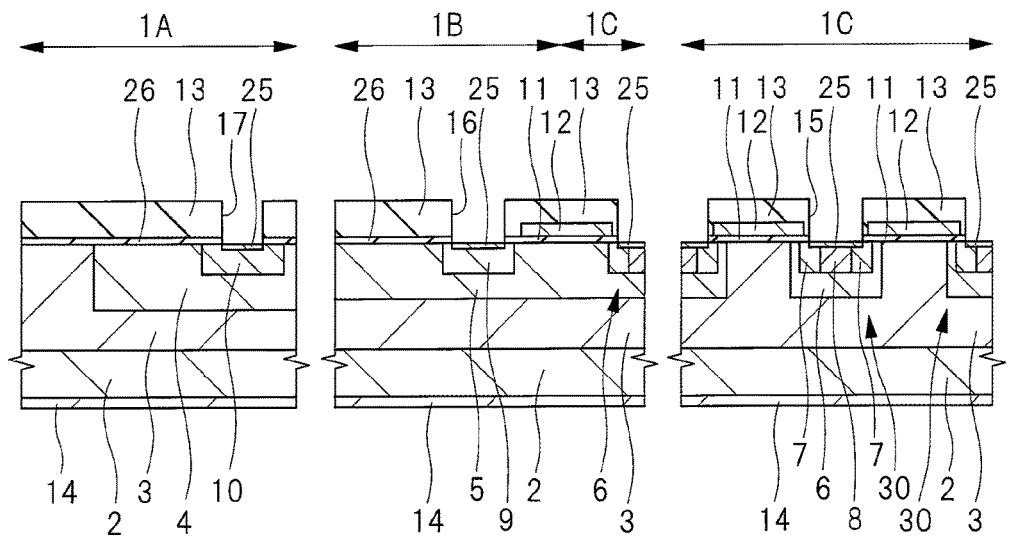
FIG. 13 is a cross-sectional view of the silicon carbide semiconductor device in a manufacturing step continued from FIG. 12.

Next, as shown in FIG. 13, after the mask 37 is removed, the silicide layer 25 is formed over the bottom portion of the opening 15 within the active region 1C, the bottom portion of the opening 16 within the hole outflow region 1B, and the bottom surface of the opening 17 within the termination region 1A. When forming the silicide layer 25, a first metal film (such as a nickel (Ni) film) is first deposited by, for example, a sputtering method so as to cover the exposed upper surface of the epitaxial layer 3. A thickness of the first metal film is, for example, approximately 0.05 μm. Subsequently, a silicidation heat treatment is performed at a temperature ranging from 600° C. to 1000° C., so that the first metal film and the epitaxial layer 3 at the bottom portion of each of the openings 15 to 17 react to form the silicide layer 25 made of, for example, nickel silicide (NiSi).

Figure 14:
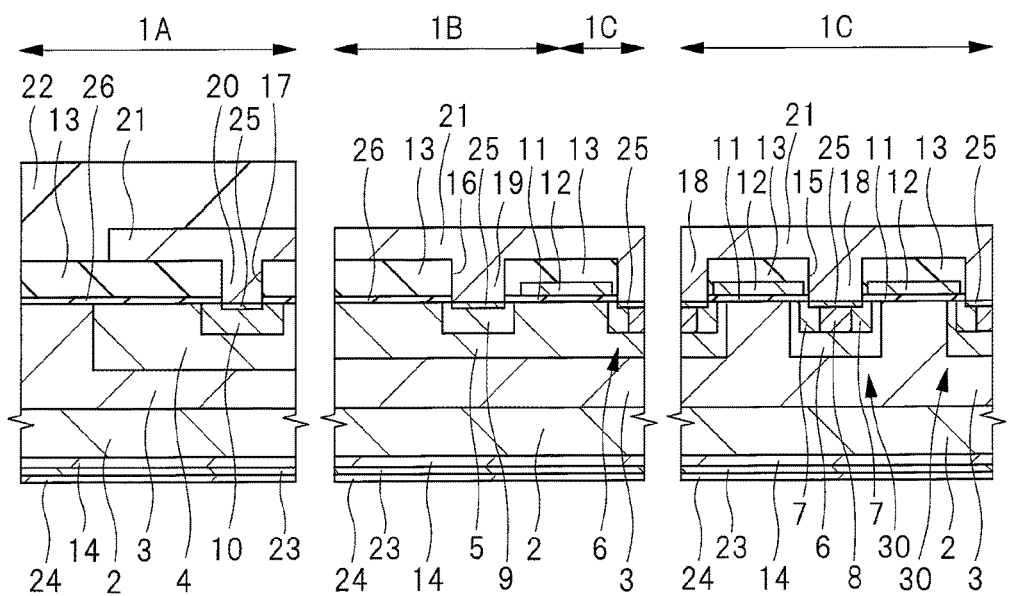
FIG. 14 is a cross-sectional view of the silicon carbide semiconductor device in a manufacturing step continued from FIG. 13.

Next, as shown in FIG. 14, a second metal film (such as a titanium (Ti) film), a titanium nitride (TiN) film and an aluminum (Al) film are stacked over the interlayer insulating film 13 in this order so as to fill each of the openings 15 to 17 and the opening (not shown) reaching the gate electrode 12. A preferable thickness of the aluminum (Al) film is, for example, greater than or equal to 1.0 μm. Subsequently, the stacked film constituted by the above-described second metal film, titanium nitride film and aluminum film is processed to form the contact plugs 18, 19 and 20, the source wiring electrode 21 and the gate wiring electrode (not shown) constituted by the stacked film.

The source wiring electrode 21 and the gate wiring electrode are constituted by the above-described stacked film formed over the interlayer insulating film 13, the contact plug 18 is constituted by the above-described stacked film filled in the opening 15, and the contact plug 20 is constituted by the above-described stacked film filled in the opening 17. The source wiring electrode 21 is electrically connected to and is in ohmic contact with the first contact region 8, the p$^+$-type semiconductor region 9 and the third contact region 10 via the silicide layer 25. In addition, the gate wiring electrode not shown is electrically connected to the gate electrode 12.

Next, an insulating film constituted by a SiO$_2$ film or a polyimide film is formed so as to cover the gate wiring electrode and the source wiring electrode 21, and the insulating film is processed to form the passivation film 22. The passivation film 22 covers a portion of the termination region 1A and is open in the hole outflow region 1B and the active region 1C.

Next, a third metal film is formed over the rear surface of the SiC substrate 2 by, for example, the sputtering method, and a laser silicidation heat treatment is performed, so that the third metal film and the SiC substrate 2 react to form the silicide layer 23. The silicide layer 23 is in contact with a lower surface of the drain region 14. A thickness of the third metal film is, for example, approximately 0.1 μm. Subsequently, the drain wiring electrode 24 is formed so as to cover the bottom surface of the silicide layer 23. The drain wiring electrode 24 is constituted by a stacked film formed by stacking a titanium (Ti) film, a nickel (Ni) film and a gold (Au) film in this order from the silicide layer 23 side, and a thickness of the stacked film ranges from 0.5 μm to 1.0 μm.

Subsequently, the SiC substrate 2 is cut in a dicing process, so that a plurality of individual semiconductor chips are obtained. In this manner, the semiconductor chip 1 which is the silicon carbide semiconductor device containing SiC-MOSFETs according to the present embodiment is completed as shown in FIGS. 1 to 3. Thereafter, an external wiring is electrically connected to each of the source wiring electrode 21, the gate wiring electrode and the drain wiring electrode 24.

<Details on Room for Improvement>

Figure 20:
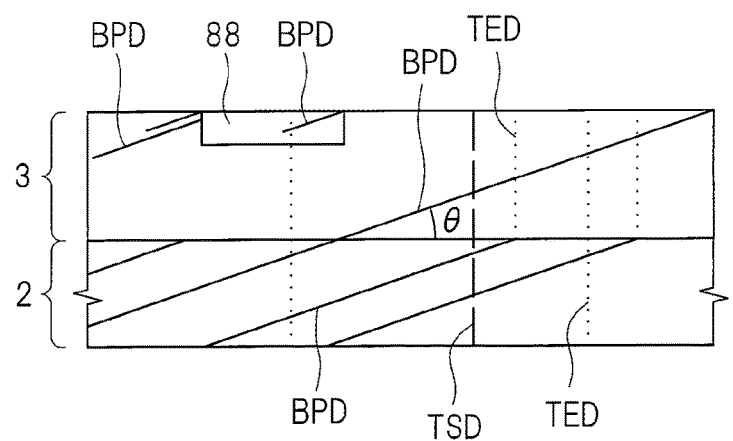
FIG. 20 is a cross-sectional view of various defects that occur in an epitaxial layer.
Figure 21:
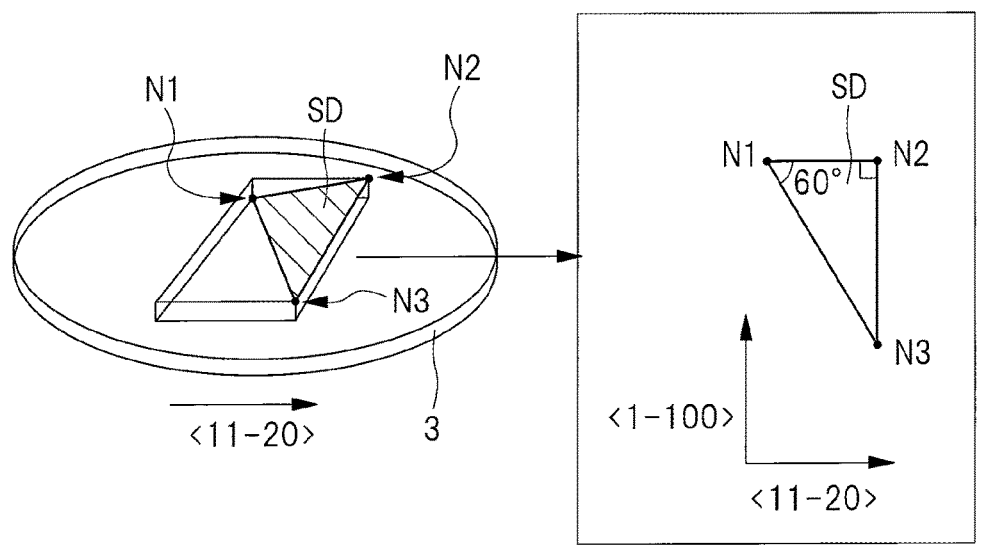
FIG. 21 is a schematic view of the epitaxial layer on a semiconductor substrate shown to describe Shockley-type stacking faults occurring in the epitaxial layer on the semiconductor substrate.
Figure 22:
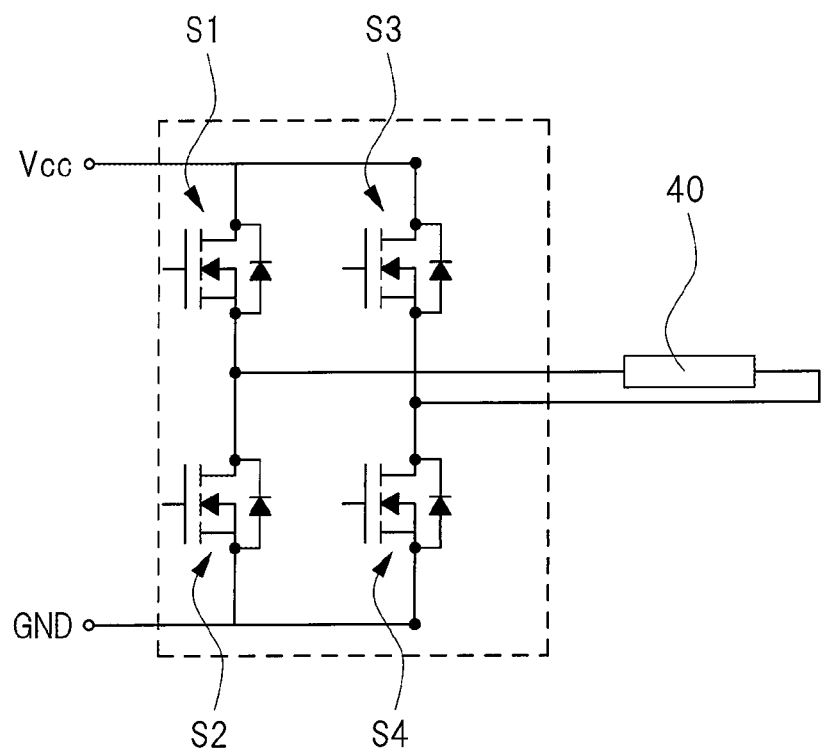
FIG. 22 is a circuit diagram of an inverter given as a comparative example.

Hereinafter, details on room for improvement will be described with reference to FIGS. 20 to 25. FIG. 20 is a cross-sectional view of the epitaxial layer in which various defects are occurring. FIG. 21 is a schematic view of the epitaxial layer on the semiconductor substrate shown to describe Shockley-type stacking faults occurring in the epitaxial layer on the semiconductor substrate. The right drawing in FIG. 21 shows a plan view of the Shockley-type stacking fault occurring in the epitaxial layer. The left drawing in FIG. 21 shows a schematic perspective view of the silicon carbide semiconductor device (silicon carbide wafer), and a rectangular portion shown at the center of the left drawing is a portion of the semiconductor substrate. The left drawing in FIG. 21 shows an ellipse representing the epitaxial layer on the semiconductor substrate, and an illustration of the underlying semiconductor substrate is omitted. FIG. 22 is a circuit diagram of an inverter given as a comparative example.

Figure 23:
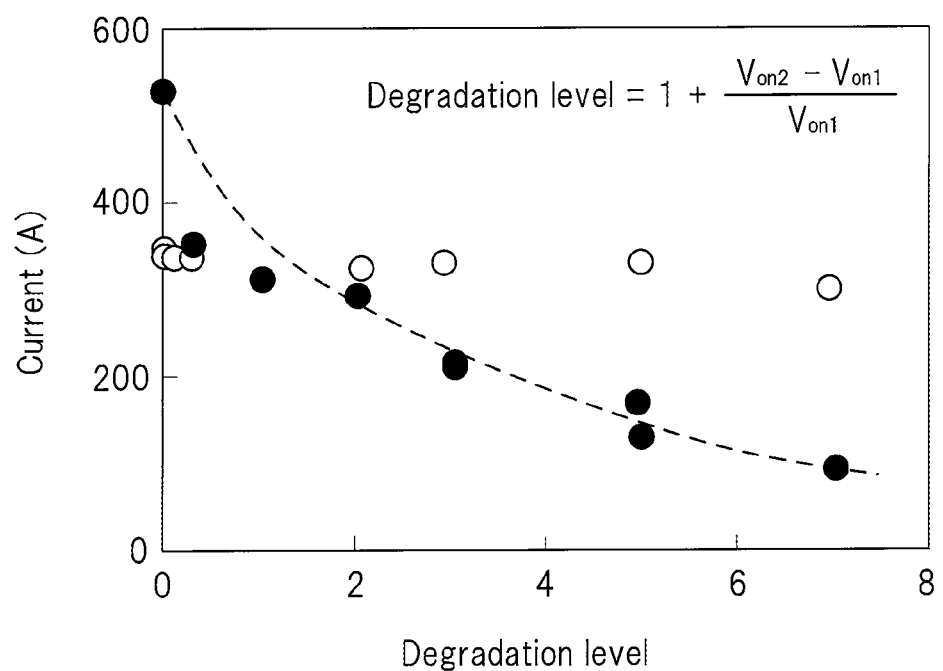
FIG. 23 is a graph showing a relation between a degradation level at an ON voltage of a SiC-MOSFET and a current value at which breakdown of the SiC-MOSFET occurs.
Figure 24:
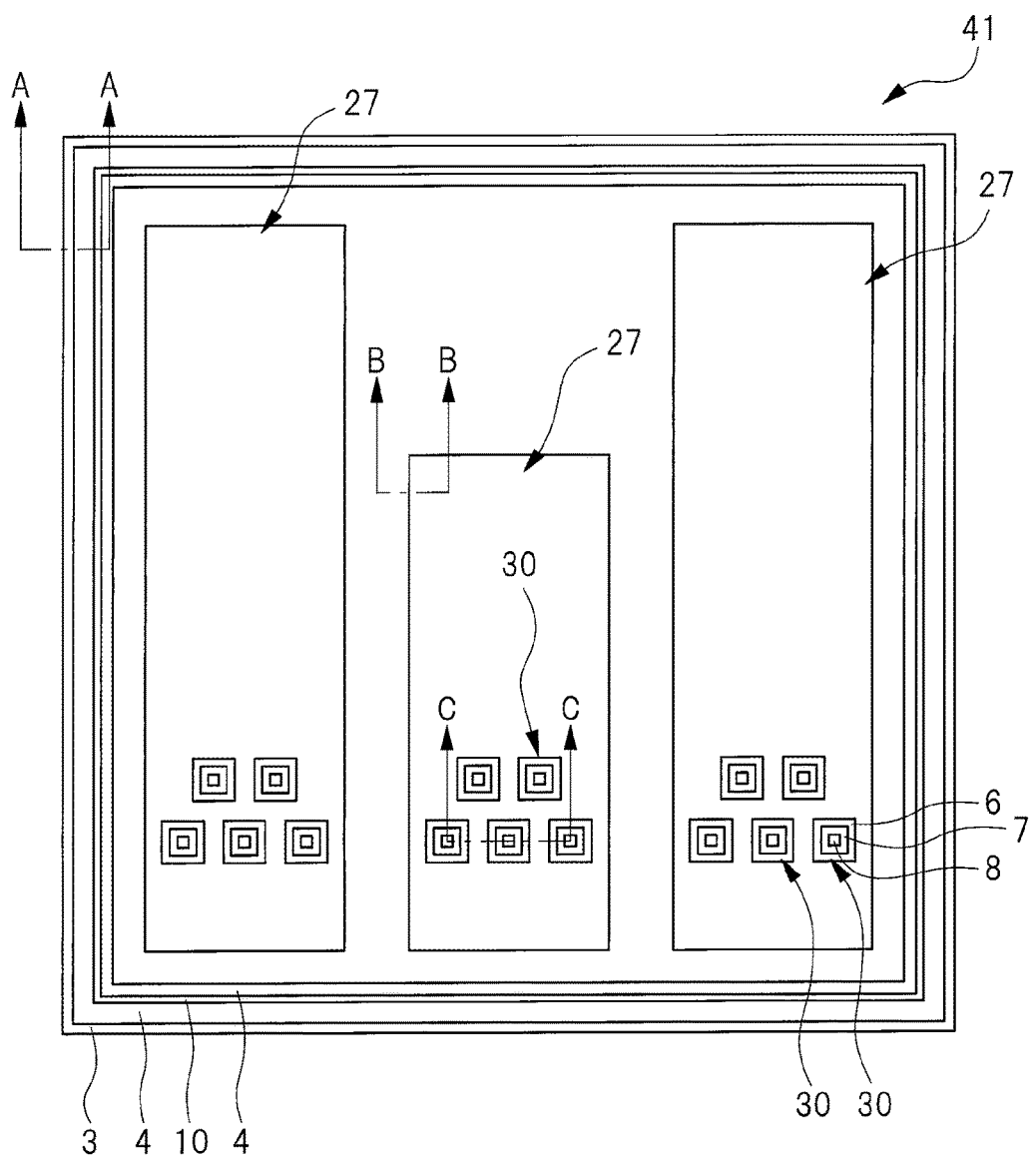
FIG. 24 is a plan view of a silicon carbide semiconductor device given as a comparative example.
Figure 25:
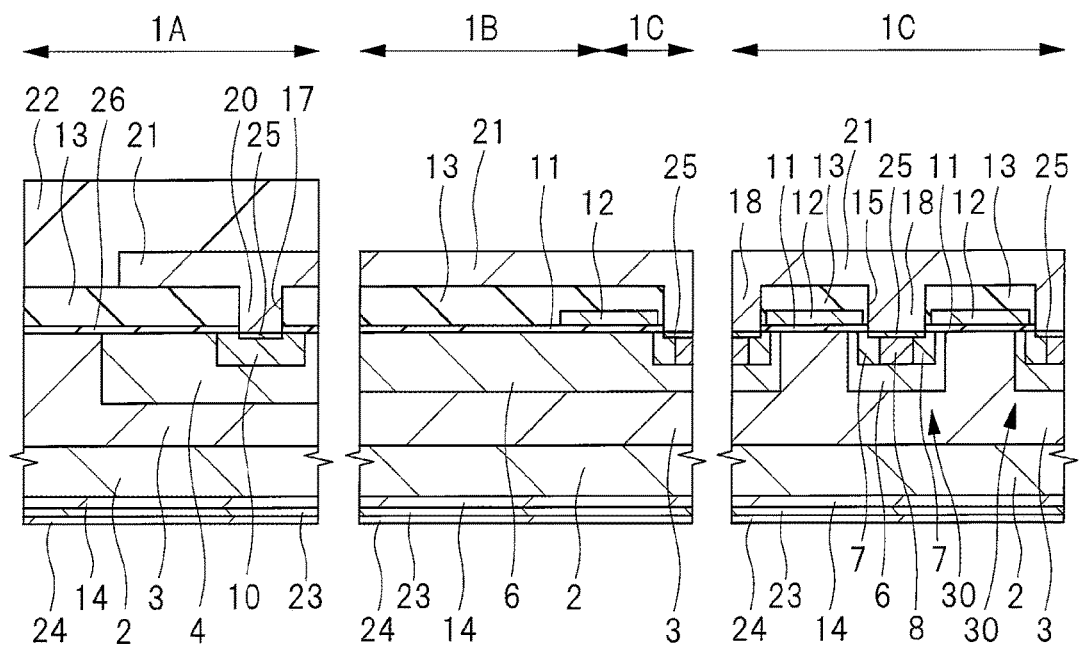
FIG. 25 is a cross-sectional view of the silicon carbide semiconductor device given as the comparative example.

FIG. 23 is a graph showing a relation between a degradation level at an ON voltage of the SiC-MOSFET and a current value at which breakdown of the SiC-MOSFET occurs. FIG. 24 is a plan view of a silicon carbide semiconductor device given as a comparative example. In FIG. 24, illustrations of the pad, the gate electrode, the interlayer insulating film and the like are omitted as in FIG. 2. FIG. 25 is a cross-sectional view of the silicon carbide semiconductor device given as the comparative example. In FIG. 25, cross sections taken along line A-A, line B-B and line C-C of FIG. 24 are shown side by side as in FIG. 3.

Types of defects present in 4H-SiC crystals used for fabricating elements include a basal plane dislocation (BPD) which is the core of the growth of stacking faults, a threading screw dislocation (TSD) and a threading edge dislocation (TED). Here, a state where a defect contained in the substrate is propagating in the epitaxial layer 3 during epitaxial growth is shown in FIG. 20. FIG. 20 shows the SiC substrate 2 and the epitaxial layer 3 containing the drift layer formed over the SiC substrate 2. In FIG. 20, BPDs are indicated by solid lines, TSDs are indicated by broken lines, and TEDs are indicated by dotted lines.

As indicated by solid lines in FIG. 20, a large number of BPDs are originally present in the SiC substrate 2, and some of these BPDs convert to TEDs during epitaxial growth and propagate in the epitaxial layer 3. On the other hand, the remaining BPDs occasionally propagate in the epitaxial layer 3 without converting to TEDs.

Here, as a method of epitaxial growth of SiC in the silicon carbide semiconductor device having the epitaxial layer 3 formed over the SiC substrate 2, a step-flow growth method is used on a surface in which a crystal axis is tilted a few degrees (such as 4 degrees or 8 degrees) from the {0001} basal plane in a <11-20> direction. Therefore, the BPD that is originally present in the crystal of the SiC substrate 2 and is the core of the growth of stacking faults propagates in the epitaxial-grown epitaxial layer (drift layer) in a diagonal direction tilted a few degrees from the main surface of the SiC substrate 2.

The TED and TSD are dislocations that propagate in a direction perpendicular to the main surface of the SiC substrate 2 and do not cause element resistance and forward voltage of the silicon carbide semiconductor device to increase. In addition, the TED and TSD are dislocations that are not capable of expanding to form a stacking fault. Therefore, the TED and TSD are harmless defects that do not have an adverse effect on properties of the silicon carbide semiconductor device as compared with the BPD. In contrast, the BPD is a defect that is capable of expanding by being energized and causes resistance of the silicon carbide semiconductor device to increase as described below.

Next, a shape of the stacking fault formed by the BPD expanding from inside the SiC substrate into the epitaxial layer and growing inside the epitaxial layer will be described with reference to FIG. 21. As shown in FIG. 21, the BPD formed in the vicinity of an interface between the SiC substrate 2 and the epitaxial layer 3 (see FIG. 20) generates in the epitaxial layer 3 with a vertex N1 closer to the SiC substrate serving as a base point and is linearly formed between the vertex N1 and a vertex N2 on the upper surface of the epitaxial layer 3. This linear defect (BPD) is formed in a diagonal direction at an off-angle θ between the main surface of the SiC substrate and the {0001} basal plane with respect to the main surface of the SiC substrate (see FIG. 20). The above-described linear BPD grows from the vertex N1 serving as the base point toward the vertex N2 in the <11-20> direction in plan view.

Here, when electrons and holes induced by energization of the p-n junction in the epitaxial layer 3 are recombined in the BPD, the emitted energy causes the BPD to expand to form a planar Shockley-type stacking fault (surface defect).

As shown in FIG. 21, the Shockley-type stacking fault SD gradually grows toward a vertex N3 on the upper surface of the epitaxial layer 3 in plan view and stops growing when the vertex N3 is reached. The Shockley-type stacking fault SD becomes a right triangle when it stops growing. This right triangle has, for example, an angle of 90 degrees at the vertex N2, an angle of 60 degrees at the vertex N1, and an angle of 30 degrees at the vertex N3. In other words, among the three sides of this right triangle, the side between the vertices N2 and N3 is present on the upper surface of the epitaxial layer 3.

The SiC power element is a vertical type element in which a current flows from a drift layer surface (source region) toward the rear surface (drain region), so that a current path is substantially perpendicular to the {0001} basal plane. The Shockley-type stacking fault SD shown in FIG. 21 behaves like a quantum well confining electrons flowing in a <0001> direction and acts as an electron trap. For this reason, a region in which the Shockley-type stacking fault SD is formed has a higher resistance than a normal region.

Thus, when a current flows perpendicularly with respect to the Shockley-type stacking fault SD, the element resistance (substrate resistance) increases accordingly. In addition, even in a case where the current flows while avoiding the Shockley-type stacking fault SD, current density increases as an area through which the current flows decreases, causing the element resistance (substrate resistance) and forward voltage (ON voltage) to increase over an energizing time. In other words, a problem in which resistance between the source and drain and resistance of the body diode in the MOSFET increase over the energizing time occurs. Namely, resistance of the silicon carbide semiconductor device increases.

However, when making the semiconductor chip into a diode-less chip for the purpose of fabricating a miniaturized and light-weight device in an all-SiC power module in which the transistor and diode are made of SiC, it is necessary to energize the p-n junction of the body diode of the MOSFET, causing a problem in which the element resistance of the SiC element increases to occur.

Note that the term "diode-less" used here means that the body diode serves as the diode (such as the Schottky barrier diode) connected in anti-parallel to the transistor in, for example, the inverter. Hence, there is no need to additionally mount a diode on the chip containing this transistor and prepare another chip which is separate from this chip containing the transistor and on which a diode is mounted, making it possible to achieve a miniaturized and lightweight device.

Hereinafter, a basic structure of the inverter configuring a power conversion device, a motor system or the like will be described with reference to FIG. 22 as an example of using the SiC-MOSFET in the inverter. In FIG. 22, the inverter is surrounded by broken lines. The pair of elements S1 and S4 and the pair of elements S2 and S3 among the four switching elements connected to a load 40 in the inverter are alternately turned ON and OFF, so that a direct-current signal is converted to an alternating-current signal and is transmitted to the load 40. If this load 40 has a high inductance as in, for example, a motor, a current flows in a reverse direction with respect to the switching element when the switching element is switched from ON to OFF. This current is referred to as an "inductor's current". The principle of the inductor's current is the same in the case of a three-phase inverter utilizing six switching elements. In order to prevent a surge voltage by the inductor's current from concentrating in the switching element which causes breakdown of the switching element, the diode for flowing the inductor's current is connected in parallel to each switching element. In order to miniaturize the inverter, it is desirable for the body diode of the switching element to be used as a freewheeling diode.

However, even in the MOSFET that is a switching element containing SiC, a bipolar degradation phenomenon in which the BPD expands to form a stacking fault occurs by using the body diode. For this reason, reliability of the SiC-MOSFET containing the stacking fault caused by bipolar degradation needs to be improved.

In order to use the body diode of the SiC-MOSFET as a freewheeling diode, it is necessary to recognize performance limits of the device such as a safe operation area (SOA) capability and a surge current capability in addition to basic properties such as static properties and switching properties. The safe operation area capability includes RBSOA (Reverse Bias Safe Operation Area) and RRSOA (Reverse Recovery Safe Operation Area) capabilities.

FIG. 23 is a graph showing a relation between the stacking fault and the RBSOA capability and between the stacking fault and the RRSOA capability. A horizontal axis of the graph of FIG. 23 shows bipolar degradation levels caused by stacking faults. Namely, the horizontal axis shows levels of an ON-voltage $V_{on2}$ of the SiC-MOSFET that increase by the expansion of the stacking fault from an ON-voltage $V_{on1}$ in an initial state where no stacking fault is present. In other words, the graph shows that the greater the numerical value of the horizontal axis, the greater the number of stacking faults will be. A vertical axis of the graph of FIG. 23 shows current values at breakdown of the RBSOA and RRSOA capabilities. In FIG. 23, each RBSOA is plotted as an open circle, and each RRSOA is plotted as a closed circle.

The RBSOA indicates a drain voltage-drain current range in which the switching element is capable of being fully turned OFF. The RBSOA capability is an operable range in which the switching element can be turned OFF by a non-repetitive gate pulse signal without causing breakdown. When RBSOA breakdown of the SiC-MOSFET occurs, a high voltage is applied to a gate oxide film at a high temperature, so that breakdown occurs regardless of presence or non-presence of a stacking fault. In other words, the RBSOA is a reliability index for the gate oxide film. As shown in FIG. 23, the current value of the RBSOA capability does not change even if bipolar degradation caused by the expansion of the stacking fault occurs.

On the other hand, the RRSOA indicates a drain voltage-drain current range for safe operation when the freewheeling diode is energized with a reverse recovery current. The RRSOA capability is an operable range in which the freewheeling diode is operable by a non-repetitive gate pulse signal without causing breakdown when energized by the recovery current. RRSOA breakdown of the SiC-MOSFET occurs at the time of recovery operation, that is, in a state where a reverse current is flowing in the body diode and the holes are flowing from the drain to the source.

Through experiments, the inventors have found that thermal energy is locally generated by the holes concentrating at the end portion of the active region during the recovery operation, causing RRSOA breakdown. The inventors have also found that, in the case where the SiC-MOSFET contains a stacking fault, the current path is limited and causes the RRSOA capability to decrease as compared with the case where the SiC-MOSFET contains no stacking fault. In other words, the portion in which the stacking fault is occurring has a high resistance and is likely to cause the temperature to increase when the current flows, further causing thermal breakdown to occur. As shown in FIG. 23, the current value of the RRSOA capability decreases as the bipolar degradation caused by the expansion of the stacking fault progresses. Note that RRSOA breakdown occurs by the holes concentrating at the end portion of the active region during the recovery operation and is not a problem for an IGBT or the like which has no body diode and in which no recovery operation occurs.

In order to increase the RRSOA capability of the SiC-MOSFET containing the stacking fault, it is important that the holes promptly flow out from the substrate during the recovery operation and are suppressed from concentration. This is also expected to improve the RRSOA capability of the SiC-MOSFET containing no stacking fault. The RRSOA capability of the SiC-MOSFET containing no stacking fault is the capability when the value in the horizontal axis of FIG. 23 is 1. Therefore, when the holes promptly flow out from the substrate during the recovery operation, the entire graph of the RRSOA indicated by broken lines of FIG. 23 increases in a positive direction of the vertical axis, so that a minimum value of the RRSOA capability is boosted.

Here, FIGS. 24 and 25 show a semiconductor chip 41 containing SiC-MOSFETs that configure a silicon carbide semiconductor device given as a comparative example. As shown in FIG. 24, the plurality of the active regions 27 are arranged on the upper surface of the semiconductor chip 41; however, unlike the present embodiment, no $p^+$-type semiconductor region 9 (see FIG. 2) is formed in the periphery of the active regions 27. As shown in the middle drawing in FIG. 25, the p-type semiconductor region 6 is formed over the upper surface of the epitaxial layer 3 outside the end portion of the active region 1C; however, no $p^+$-type semiconductor region 9 for flowing out the holes is formed on the upper surface of the p-type semiconductor region 6, and no contact plug is formed either.

In the SiC-MOSFET shown in FIGS. 24 and 25, the holes are likely to accumulate in the vicinity of the end portion of the active region 1C at the time of recovery operation in which the inductor's current flows in the body diode; however, this SiC-MOSFET does not have a structure for flowing out these holes. Therefore, accumulation of a large amount of holes causes the RRSOA capability to decrease, leaving room for improvement in improving reliability of the silicon carbide semiconductor device. This problem becomes more apparent as the number of stacking faults (BPDs) increases since the holes are more likely to accumulate.

Effects of Present Embodiment

As described above, the holes during recovery operation concentrate at the end portion of the active region, causing thermal breakdown to occur. Thus, as shown in FIGS. 2 and 3, in the silicon carbide semiconductor device of the present embodiment, the p$^+$-type semiconductor region 9 surrounding the periphery of each active region 1C (27) is formed on the upper surface of the epitaxial layer 3. Hence, the holes in the semiconductor substrate can flow out to the source wiring electrode 21 via the p-type semiconductor region 5 and the p$^+$-type semiconductor region 9.

For this reason, even if a stacking fault occurs in the semiconductor substrate in the vicinity of the end portion of the active region 1C (27) of the semiconductor chip 1 and the holes are accumulated in such a region at the time of recovery operation, the holes can flow out via the p-type semiconductor region 5 and the p$^+$-type semiconductor region 9. Thus, heat generation caused by accumulation of the holes can be prevented. For this reason, it is possible to prevent thermal breakdown that occurs when a current is flowed in the SiC-MOSFET. Namely, the RRSOA capability can be increased.

Here, the holes in the vicinity of the end portion of the active region 1C (27) can promptly flow out even in a case where a stacking fault is formed, so that the RRSOA capability can be increased even if a density of the basal plane dislocations which are stacking faults in the semiconductor chip is, for example, greater than or equal to 0.1 BPDs/cm$^2$ and less than 10 BPDs/cm$^2$. In other words, reliability of the silicon carbide semiconductor device having the stacking fault can be improved. Note that, in the case where the density of the basal plane dislocations is 10 BPDs/cm$^2$ or more, the semiconductor chip would have an excessively high resistance and would cause a problem in which the SiC-MOSFET would not operate properly.

In order to allow the holes to promptly flow out from the substrate, it may be considered to form the p-type semiconductor region 5, or the p-type semiconductor region 5 and the p$^+$-type semiconductor region 9, much deeper. However, if the p-type semiconductor region 5, or the p-type semiconductor region 5 and the p$^+$-type semiconductor region 9, are formed so as to be deeper than the p-type semiconductor region 4 within the termination region 1A, a problem in which the breakdown voltage at the end portion of the semiconductor chip 1 cannot be maintained occurs. In addition, if the p-type semiconductor region 5, or the p-type semiconductor region 5 and the p$^+$-type semiconductor region 9, are formed so as to be deeper than the p-type semiconductor region 4 within the termination region 1A, a depletion region is likely to expand in the semiconductor substrate at the time of recovery operation and is likely to cause local charge concentration, causing the breakdown voltage to decrease.

Thus, in the present embodiment, the p-type semiconductor region 5 is formed so as to have a depth that is shallower than that of the p-type semiconductor region 4 and is the same as that of the p-type semiconductor region 6, and the p$^+$-type semiconductor region 9 is formed so as to have a depth that is shallower than the p-type semiconductor region 5. Hence, breakdown voltage of the silicon carbide semiconductor device is prevented from decreasing.

Here, a p-type impurity concentration of the p$^+$-type semiconductor region 9 ranges from $1 \times 10^{18}$ cm$^{-3}$ to $1 \times 10^{20}$ cm$^{-3}$. The reason for this is as follows. Namely, if the p-type impurity concentration is less than $1 \times 10^{18}$ cm$^{-3}$, it becomes difficult for the holes to flow out through the p$^+$-type semiconductor region 9. In addition, when the p-type impurity concentration is greater than $1 \times 10^{20}$ cm$^{-3}$, a defect occurs in a region to which p-type impurities (such as aluminum (Al)) are implanted for forming the p$^+$-type semiconductor region 9.

<Modification>

Figure 15:
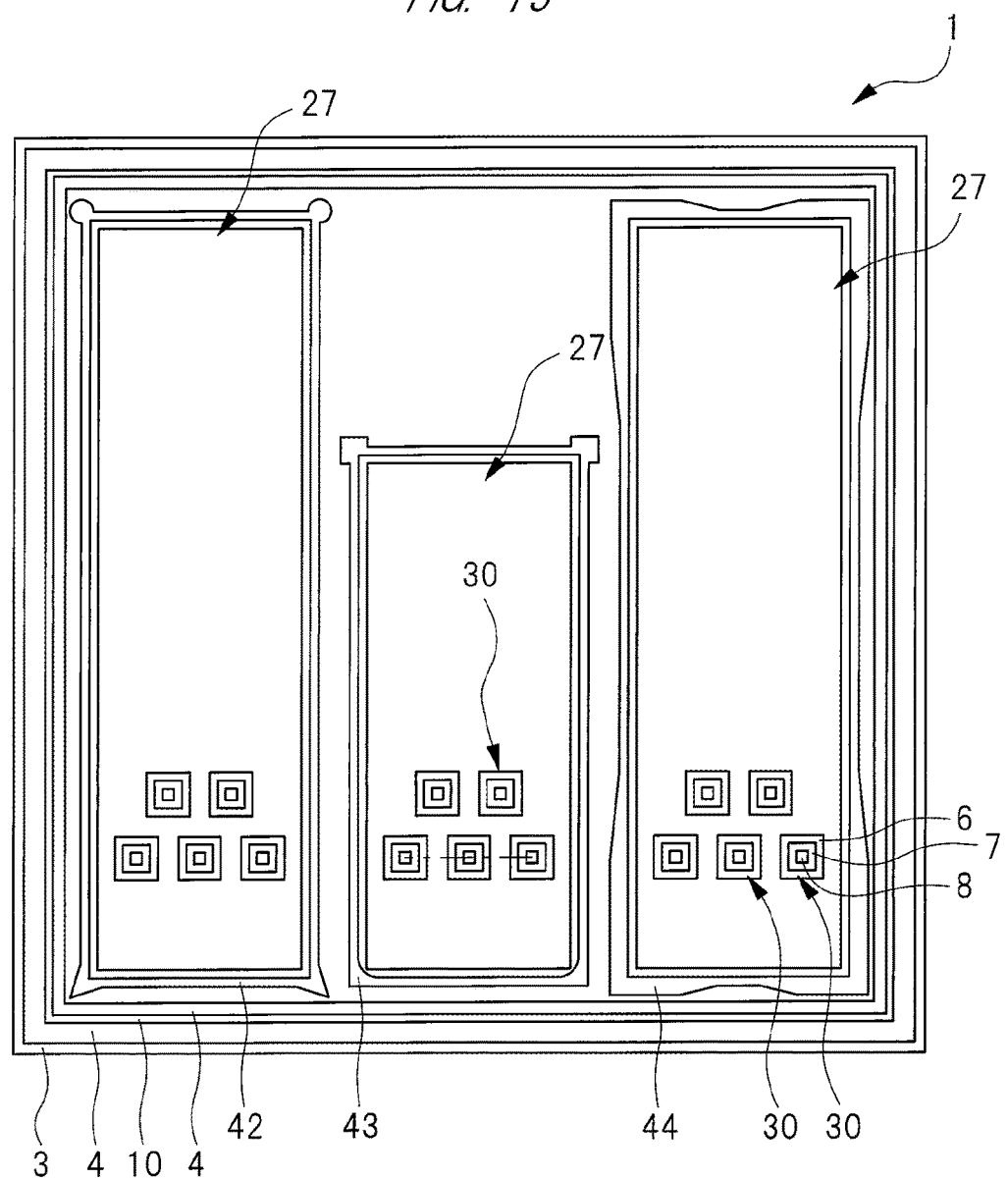
FIG. 15 is a plan view of a silicon carbide semiconductor device according to a modification of the first embodiment of the present invention.

FIG. 15 is a plan view of a silicon carbide semiconductor device according to a modification of the first embodiment. FIG. 15 is a plan view corresponding to FIG. 2.

As shown in FIG. 15, in the SiC-MOSFET of the present modification, p$^+$-type semiconductor regions 42 to 44 for flowing out the holes are formed in the periphery of each active region 27 and have planar shapes that differ from the p$^+$-type semiconductor region 9 shown in FIG. 2. Namely, the p$^+$-type semiconductor region 9 shown in FIG. 2 has a uniform width throughout each corner portion and four sides of the frame-like layout. On the other hand, each of the p$^+$-type semiconductor regions 42 to 44 of the present modification has a rectangular layout, that is, a frame-like layout surrounding each rectangular active region 27, and each corner portion of this frame-like layout has a width that is wider than those of its four sides.

The holes are likely to accumulate in the periphery of the active regions 27 at the time of recovery operation of the SiC-MOSFET and are likely to particularly concentrate in each corner portion of the active regions 27 in plan view. For this reason, in the present modification, a width of the p$^+$-type semiconductor regions 42 to 44 in the vicinity of each corner portion of the active regions 27 is set to be wider in plan view, so that the holes in this vicinity of the corner portions can promptly flow out and the RRSOA capability can be increased.

FIG. 15 shows several variations of the p$^+$-type semiconductor regions 42 to 44 where the width of each of the p$^+$-type semiconductor regions 42 to 44 is increased in the vicinity of each corner portion of the active regions 27. For example, as shown in FIG. 15, a structure in which corner portions on an upper side of the p$^+$-type semiconductor region 42 (positions closer to the gate pad 28) are expanded into a round shape or a structure in which corner portions on a lower side of the p$^+$-type semiconductor region 42 are expanded into a triangular shape is conceivable.

In addition, as shown in FIG. 15, a structure in which corner portions on an upper side of the p$^+$-type semiconductor region 43 (positions closer to the gate pad 28) are expanded into a square shape or a structure in which inner portions of corner portions on a lower side of the p$^+$-type semiconductor region 43 are expanded so as to be closer to the active region 27 is conceivable. In this case, the p$^+$-type semiconductor region 43 may be formed so as to be closer to the active region 27 until it is not in contact with the first contact region 8 within the active region 27 (see FIG. 3). In addition, as shown in FIG. 15, the p$^+$-type semiconductor region 44 may be formed so as to have thick corner portions by gradually widening the width from each center portion of the four sides toward the corner portions.

As described above, the width of the p$^+$-type semiconductor regions 42 to 44 in the vicinity of each corner portion of the active regions 27 is greater than the width of the p+-type semiconductor regions 42 to 44 extending along each of four sides of the active regions 27 in plan view. By widening the width of the p+-type semiconductor regions 42 to 44 in the vicinity of each corner portion of the active regions 27 in plan view, the holes that are likely to accumulate in each corner portion of the p+-type semiconductor regions 42 to 44 can promptly flow out. For this reason, the RRSOA capability can be further increased in the present modification.

Second Embodiment

Figure 16:
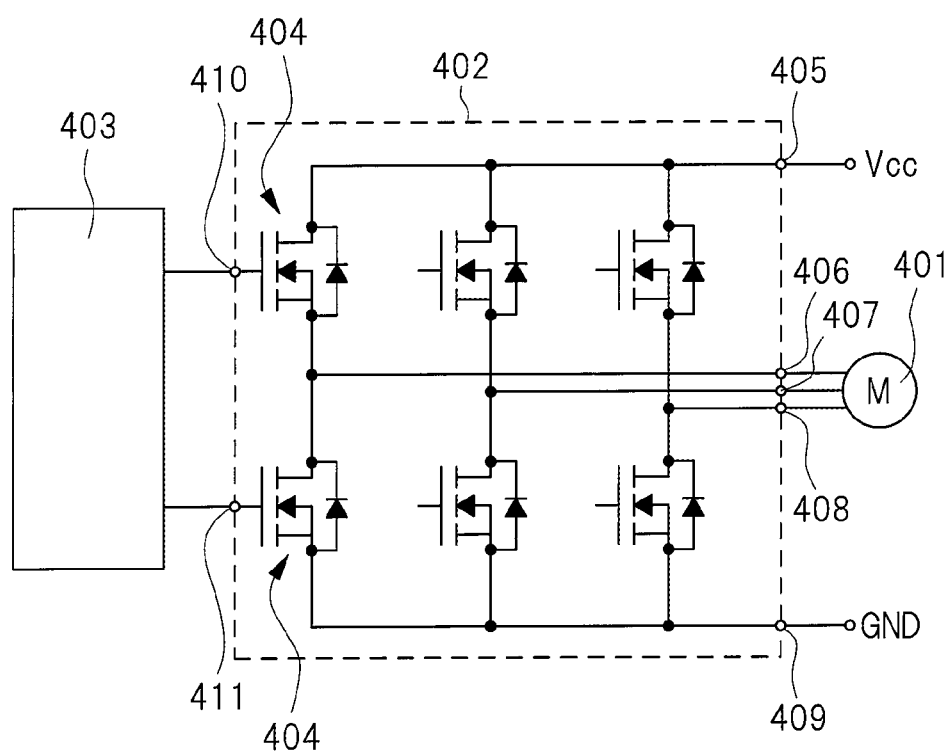
FIG. 16 is a circuit diagram of a power conversion device according to a second embodiment of the present invention.

The power conversion device comprising the SiC power element (SiC-MOSFET) of the first embodiment will be described as a second embodiment. FIG. 16 is a circuit diagram of the power conversion device (inverter) according to the present embodiment. As shown in FIG. 16, the inverter of the present embodiment has a plurality of SiC power MISFETs (Metal Insulator Semiconductor FETs) 404 each serving as the switching element in a power module 402. Some of the SiC power MISFETs 404 are connected between a power-supply voltage Vcc and an input potential of a load 401 (such as a motor) via terminals 405 to 409 in each phase, and these SiC power MISFETs 404 configure an upper arm. In addition, other SiC power MISFETs 404 are connected between the input potential of the load 401 and a ground potential GND in each phase, and these SiC power MISFETs 404 configure a lower arm. In other words, two SiC power MISFETs 404 are provided in each phase of the load 401, and six switching elements (SiC power MISFETs 404) are provided in three phases.

The power-supply voltage Vcc is connected to a drain electrode of the SiC power MISFET 404 in each phase via the terminal 405, and the ground potential GND is connected to a source electrode of the SiC power MISFET 404 in each phase via the terminal 409. In addition, the load 401 is connected to the source electrode of the SiC power MISFET 404 in the upper arm of each phase via the terminals 406 to 408 and is also connected to the drain electrode of the SiC power MISFET 404 in the lower arm of each phase via the terminals 406 to 408.

Further, a control circuit 403 is connected to the gate electrode of each SiC power MISFET 404 via terminals 410 and 411, and the SiC power MISFETs 404 are controlled by this control circuit 403. Therefore, the inverter of the present embodiment is capable of driving the load 401 by controlling the current flowing in the SiC power MISFETs 404 configuring the power module 402 by the control circuit 403.

The SiC power MISFETs 404 utilize the MOSFETs formed in the semiconductor chip 1 described in the first embodiment (see FIG. 1). As shown in FIG. 16, a body diode contained in the above-described MOSFET is formed in each SiC power MISFET 404.

Namely, the anode of the body diode is connected to the source electrode of the MOSFET, and the cathode of the body diode is connected to the drain electrode of the MOSFET. Thus, each body diode in each phase shown in FIG. 16 is connected in anti-parallel with respect to the corresponding MOSFET. A function of the body diode at this time will be described below.

In the case where the load 401 is a pure resistance containing no inductance, the body diode is unnecessary since there is no energy to reflow. However, in a case where a circuit containing an inductance as in a motor (electric motor) is connected to the load 401, there is a mode for flowing a load current in a reverse direction with respect to the MOSFET serving as a switching element turned ON. At this time, the MOSFET itself does not have a function to flow the load current in the reverse direction, so that it is necessary to connect the body diode in anti-parallel with the MOSFET.

Namely, in a case of the load 401 containing an inductance as in a motor, the energy accumulated in the load 401 needs to be discharged when the MOSFET is turned OFF in the power module 402. However, the MOSFET itself fails to flow the reverse current for discharging the energy accumulated in the load 401. Thus, the body diode is connected to the MOSFET in a reverse direction in order to reflow the electric energy accumulated in the load 401. In other words, the body diode has a function to flow the reverse current in order to discharge the electric energy accumulated in the load 401.

In the case where the power module 402 is constituted by the MOSFET and the diode, connecting a semiconductor chip provided with a diode to a semiconductor chip provided with a MOSFET is conceivable. However, in this case, the semiconductor chip containing the diode would need to be prepared in addition to the semiconductor chip containing the MOSFET, whereby a problem in which the sizes of the power module 402 and the inverter undesirably increase occurs. Also, in the case where, instead of preparing another semiconductor chip containing the diode, a Schottky barrier diode or the like to be connected to the MOSFET is additionally mounted on the semiconductor chip on which this MOSFET is formed, a problem in which the sizes of the power module 402 and inverter undesirably increase occurs. In addition, preparing a diode instead of making it diode-less as described above causes manufacturing costs of the silicon carbide semiconductor device to increase.

On the other hand, the power module 402 of the present embodiment utilizes the semiconductor chip configuring the silicon carbide semiconductor device of the first embodiment for the MOSFET and the body diode. In other words, the MOSFET and the body diode connected in anti-parallel to this MOSFET shown in FIGS. 1 to 4 are provided on one semiconductor chip. The semiconductor chip containing the BPD has a problem in which the holes are likely to accumulate in the end portion of the active regions when a p-n current is flowed in the body diode, causing thermal breakdown to occur. However, the silicon carbide semiconductor device described in the first embodiment is provided with the p+-type semiconductor region 9 for flowing out the holes in the vicinity of the end portion of the active region (see FIG. 3), so that the holes accumulated in the vicinity of the end portion of the active region are flowed out and the RRSOA capability is suppressed from decreasing.

Here, the body diode of the MOSFET configuring the semiconductor chip which is the silicon carbide semiconductor device described in the first embodiment can be utilized as the body diode shown in FIG. 16, so that it is unnecessary to connect this semiconductor chip containing the MOSFET to another diode. Hence, even if the SiC-MOSFET corresponding to the power conversion device constituted by the inverter containing the power module 402 has a stacking fault, a miniaturized, light-weight and low-cost power conversion device can be achieved while preventing the RRSOA capability of the SiC-MOSFET from decreasing.

In addition, the power conversion device can be utilized in a three-phase motor system. The load 401 shown in FIG. 16 is a three-phase motor, and by utilizing the power conversion device comprising the silicon carbide semiconductor device described in the first embodiment in the inverter, the three-phase motor system can be miniaturized.

Third Embodiment

Figure 17:
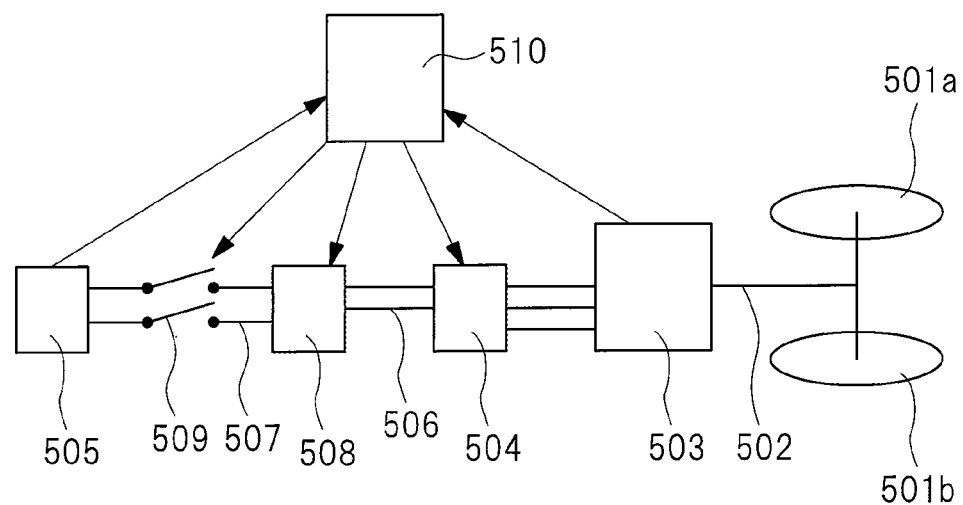
FIG. 17 is a schematic view of a configuration of an electric car according to a third embodiment of the present invention.
Figure 18:
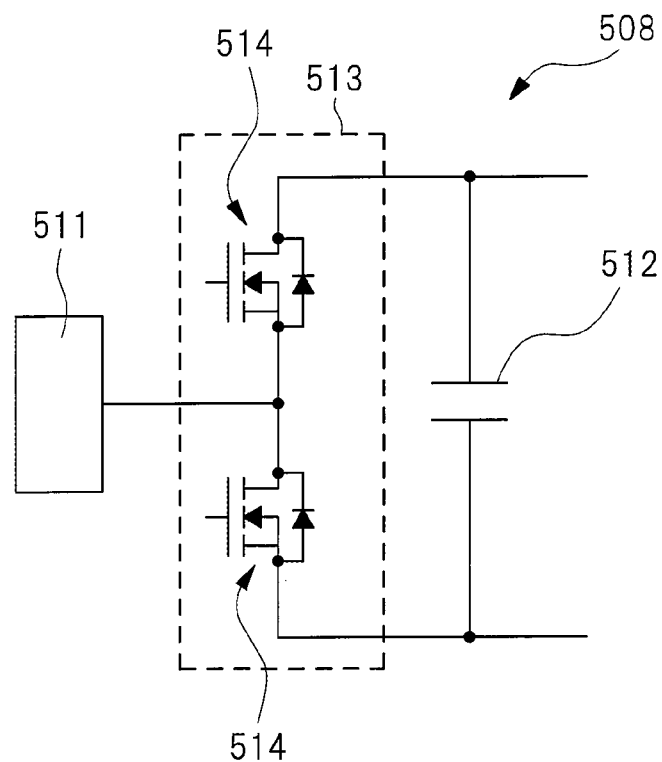
FIG. 18 is a circuit diagram of a boost converter according to the third embodiment of the present invention.

The three-phase motor system described in the second embodiment can be utilized in automobiles such as hybrid cars, electric cars, fuel cell cars and the like. In the present embodiment, automobiles equipped with the three-phase motor system will be described with reference to FIGS. 17 and 18. FIG. 17 is a schematic view showing a configuration of the electric car according to the present embodiment. FIG. 18 is a circuit diagram of a boost converter according to the present embodiment.

As shown in FIG. 17, the electric car of the present embodiment comprises: a three-phase motor 503 capable of inputting and outputting power to a drive shaft 502 to which a drive wheel (wheel) 501*a* and a drive wheel (wheel) 501*b* are connected; an inverter 504 for driving the three-phase motor 503; and a battery 505. The electric car of the present embodiment further comprises a boost converter 508, a relay 509 and an electronic control unit 510, and the boost converter 508 is connected to a power line 506 to which the inverter 504 is connected and a power line 507 to which the battery 505 is connected. The three-phase motor 503 is a synchronous generator-motor comprising a rotor in which a permanent magnet is embedded and a stator on which a three-phase coil is wound. The inverter described in the second embodiment is utilized for the inverter 504.

As shown in FIG. 18, the boost converter 508 is constituted by a configuration in which a reactor 511 and a smoothing capacitor 512 are connected to an inverter 513. The inverter 513 is similar to, for example, the inverter described in the second embodiment and the element configuration in the inverter is the same as well. As in the second embodiment, a SiC power MISFET 514 serves as the switching element and is driven by synchronous rectification. In the electric car of the present embodiment, the inverter 504 and the boost converter 508 which are power conversion devices are utilized to supply an output to the three-phase motor 503 such that the drive wheels (wheels) 501*a* and 501*b* are driven by the three-phase motor 503.

The electronic control unit 510 of FIG. 17 comprises a microprocessor, a storage device and an input/output port, and receives signals from a sensor that detects a rotor position of the three-phase motor 503, or receives charge/discharge values of the battery 505. The electronic control unit 510 outputs signals for controlling the inverter 504, the boost converter 508 and the relay 509.

According to the present embodiment, the power conversion device of the second embodiment can be utilized for the inverter 504 and the boost converter 508 which are power conversion devices. In addition, the three-phase motor system of the second embodiment can be utilized for the three-phase motor system constituted by the three-phase motor 503, the inverter 504 and the like. Hence, a miniaturized, light-weight and low-cost electric car can be achieved by reducing the volume of the drive system in the electric car while preventing the RRSOA capability of the inverter 504 and the boost converter 508 of the electric car from decreasing.

Note that an electric car has been described in the present embodiment; however, the above-described three-phase motor system can be similarly applied to a hybrid car which uses an engine and a battery in combination and to a fuel cell car in which the battery 505 is a fuel cell stack.

Fourth Embodiment

Figure 19:
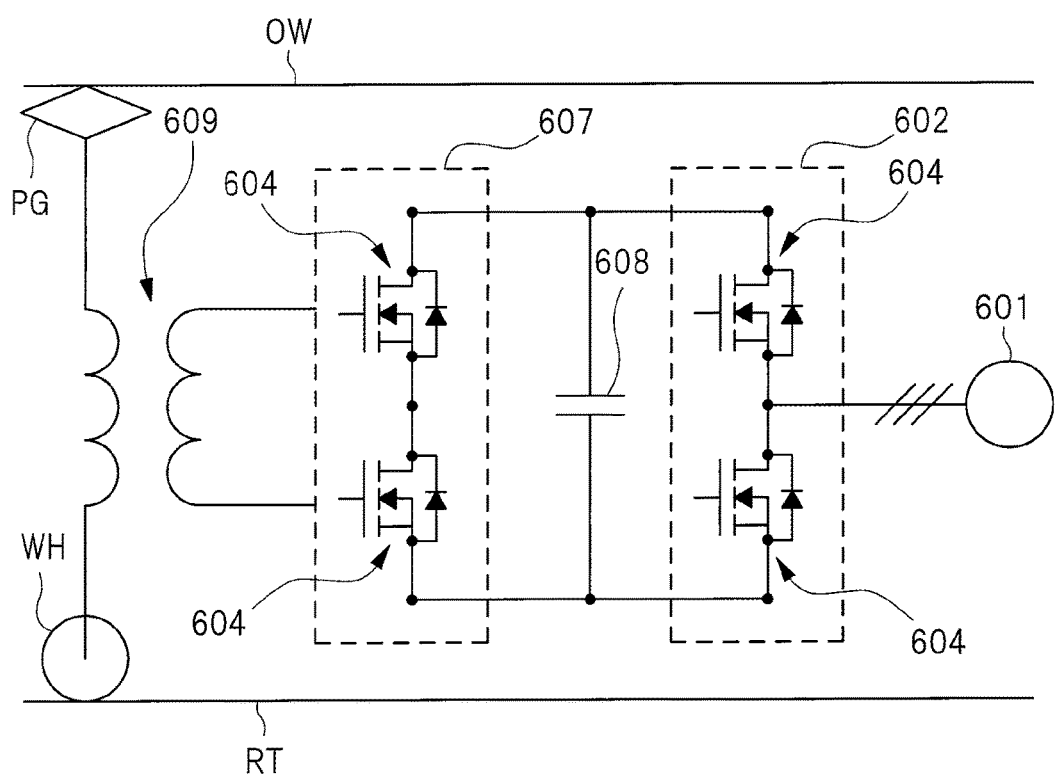
FIG. 19 is a circuit diagram of a converter and an inverter provided in a railway vehicle according to a fourth embodiment of the present invention.

The three-phase motor system of the second embodiment can be utilized in a railway vehicle. In the present embodiment, the railway vehicle utilizing the three-phase motor system will be described with reference to FIG. 19. FIG. 19 is a circuit diagram of the converter and the inverter provided in the railway vehicle according to the present embodiment.

As shown in FIG. 19, a power of, for example, 25 kV is supplied from an overhead wire OW to the railway vehicle via a pantograph PG. The voltage of the power is reduced to 1.5 kV via a transformer 609 and an alternating current is converted to a direct current by a converter 607. The direct current is further converted to an alternating current by an inverter 602 via a capacitor 608, so that the three-phase motor which is the load 601 is driven. As in the second embodiment, a SiC power MISFET 604 serves as the switching element in the present embodiment and is driven by synchronous rectification. Note that, in FIG. 19, an illustration of the control circuit described in the second embodiment is omitted. In addition, the overhead wire OW is electrically connected to a railway track RT via the pantograph PG, the transformer 609 and wheels WH.

According the present embodiment, the power conversion device of the second embodiment can be utilized in the converter 607. In other words, the wheels WH of the railway vehicle can be driven by supplying power from the power conversion device to the load 601. In addition, the three-phase motor system of the second embodiment can be utilized for the three-phase motor system constituted by the load 601, the inverter 602 and the control circuit. Hence, a miniaturized, light-weight and low-cost railway vehicle can be achieved while preventing the RRSOA capabilities of the inverter 602 and the converter 607 of the railway vehicle from decreasing.

In the foregoing, the invention made by the present inventors has been concretely described based on the embodiments. However, the present invention is not limited to the foregoing embodiments and various modifications and alterations can be made within the scope of the present invention.

For example, an n-type silicon carbide semiconductor device has been described in each of the first and second embodiments; however, the same effects described in the first and second embodiments can be obtained even if the conductivity type (first conductivity type) of the silicon carbide semiconductor device is a p-type. In this case, the conductivity types of the impurities implanted to each of the above-described various substrates, semiconductor layers, semiconductor regions or the like differ from those described above. In other words, the conductivity type (first conductivity type) of the substrates, layers, and regions of each embodiment described as having an n-type conductivity is a p-type, while the conductivity type (second conductivity type) of the regions (such as the p-type semiconductor region 6 and the first contact region 8 shown in FIG. 2) described as having a p-type conductivity is an n-type. In this case, for example, B (boron) or Al (aluminum) can be used as p-type impurities.

What is claimed is:

1. A silicon carbide semiconductor device comprising:
   a semiconductor substrate which includes an n-type substrate containing silicon carbide and an n-type semiconductor layer containing silicon carbide formed over the n-type substrate, the semiconductor substrate having an element region and a first region surrounding the element region in plan view;
   a p-type first semiconductor region formed on an upper surface of the semiconductor substrate within the element region;

an n-type source region formed on an upper surface of the first semiconductor region;
a p-type first contact region formed on the upper surface of the first semiconductor region;
a p-type second semiconductor region formed on the upper surface of the semiconductor substrate within the first region and surrounding the element region in plan view;
a p-type second contact region formed on an upper surface of the second semiconductor region and surrounding the element region in plan view;
an n-type drain region formed on a lower surface of the semiconductor substrate;
a gate electrode formed on the upper surface of the first semiconductor region adjacent to the source region via an insulating film;
a first electrode formed on the second contact region; and
a conductive connecting portion formed on the second contact region and electrically connecting the first electrode and the second contact region to each other,
wherein the gate electrode, the source region and the drain region configure a field effect transistor, and
the second semiconductor region and the semiconductor substrate configure a diode.

2. The silicon carbide semiconductor device according to claim 1, further comprising:
a second region formed in a peripheral portion of the semiconductor substrate and surrounding the element region and the first region in plan view;
a p-type third semiconductor region formed on the upper surface of the semiconductor substrate within the second region so as to be deeper than each of the first semiconductor region and the second semiconductor region; and
a p-type third contact region formed on an upper surface of the third semiconductor region.

3. The silicon carbide semiconductor device according to claim 1,
wherein the gate electrode and the second contact region are arranged apart from each other in plan view.

4. The silicon carbide semiconductor device according to claim 1,
wherein a third impurity concentration of the first contact region is greater than a first impurity concentration of the first semiconductor region, and
a fourth impurity concentration of the second contact region is greater than a second impurity concentration of the second semiconductor region.

5. The silicon carbide semiconductor device according to claim 1,
wherein the first contact region is shallower than the first semiconductor region, and
the second contact region is shallower than the second semiconductor region.

6. The silicon carbide semiconductor device according to claim 1,
wherein an impurity concentration of the second contact region ranges from $1 \times 10^{18}$ cm$^{-3}$ to $1 \times 10^{21}$ cm$^{-3}$.

7. The silicon carbide semiconductor device according to claim 1,
wherein a shortest distance between the first contact region and the second contact region ranges from 2.0 µm to 20 µm.

8. The silicon carbide semiconductor device according to claim 1,
wherein a density of basal plane dislocations (BPDs) in the semiconductor layer is greater than or equal to 0.1 BPDs/cm$^2$ and less than 10 BPDs/cm$^2$.

9. The silicon carbide semiconductor device according to claim 1,
wherein the element region has a rectangular shape in plan view, and
a width of the second contact region in the vicinity of a corner portion of the element region is greater than a width of the second contact region extending along each of four sides of the element region in plan view.

10. The silicon carbide semiconductor device according to claim 1,
wherein a smallest width of the second contact region is greater than a width of the first contact region.

11. A power module comprising the silicon carbide semiconductor device according to claim 1.

12. A power conversion device comprising:
a power module having the silicon carbide semiconductor device according to claim 1; and
a control circuit for controlling the silicon carbide semiconductor device in the power module.

* * * * *